(12) United States Patent
Yu et al.

(10) Patent No.: US 12,051,649 B2
(45) Date of Patent: Jul. 30, 2024

(54) ARCHITECTURE FOR COMPUTING SYSTEM PACKAGE

(71) Applicant: Taiwan Semiconductor Manufacturing Co., Ltd., Hsinchu (TW)

(72) Inventors: Chen-Hua Yu, Hsinchu (TW); Chieh-Yen Chen, Taipei (TW); Chuei-Tang Wang, Taichung (TW); Chung-Hao Tsai, Huatan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/355,824

(22) Filed: Jul. 20, 2023

(65) Prior Publication Data
US 2024/0038669 A1 Feb. 1, 2024

Related U.S. Application Data

(63) Continuation of application No. 17/229,322, filed on Apr. 13, 2021, now Pat. No. 11,769,731.
(Continued)

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4857* (2013.01); *H01L 21/486* (2013.01);
(Continued)

(58) Field of Classification Search
CPC .............. H01L 21/4857; H01L 21/486; H01L 21/6835; H01L 21/568; H01L 23/49822;
(Continued)

(56) References Cited

U.S. PATENT DOCUMENTS 8,164,171 B2   4/2012 Lin et al.
9,065,722 B2*  6/2015 Thottethodi ........ H01L 25/0652
(Continued)

FOREIGN PATENT DOCUMENTS

KR  20120011076 A   2/2012
KR  20200041265 A   4/2020
WO  2019240901 A1  12/2019

*Primary Examiner* — Victor A Mandala
*Assistant Examiner* — Lawrence C Tynes, Jr.
(74) *Attorney, Agent, or Firm* — Slater Matsil, LLP

(57) ABSTRACT

A method includes forming a reconstructed wafer, which includes forming a redistribution structure over a carrier, bonding a first plurality of memory dies over the redistribution structure, bonding a plurality of bridge dies over the redistribution structure, and bonding a plurality of logic dies over the first plurality of memory dies and the plurality of bridge dies. Each of the plurality of bridge dies interconnects, and is overlapped by corner regions of, four of the plurality of logic dies. A second plurality of memory dies are bonded over the plurality of logic dies. The plurality of logic dies form a first array, and the second plurality of memory dies form a second array.

20 Claims, 45 Drawing Sheets

Related U.S. Application Data

(60) Provisional application No. 63/137,375, filed on Jan. 14, 2021.

(51) Int. Cl.
*H01L 23/00* (2006.01)
*H01L 23/48* (2006.01)
*H01L 23/498* (2006.01)
*H01L 25/10* (2006.01)

(52) U.S. Cl.
CPC ...... *H01L 23/481* (2013.01); *H01L 23/49816* (2013.01); *H01L 23/49822* (2013.01); *H01L 23/49838* (2013.01); *H01L 23/5383* (2013.01); *H01L 23/5386* (2013.01); *H01L 24/16* (2013.01); *H01L 24/81* (2013.01); *H01L 25/105* (2013.01); *H01L 2224/16146* (2013.01); *H01L 2224/16165* (2013.01); *H01L 2224/818* (2013.01); *H01L 2225/1023* (2013.01); *H01L 2225/1058* (2013.01); *H01L 2924/1431* (2013.01); *H01L 2924/1434* (2013.01); *H01L 2924/182* (2013.01)

(58) Field of Classification Search
CPC .............. H01L 23/3128; H01L 23/5381; H01L 23/5389; H01L 23/481; H01L 23/49816; H01L 23/49838; H01L 23/5383; H01L 23/5386; H01L 23/31; H01L 2225/1023; H01L 2225/1058; H01L 2225/06524; H01L 2225/06527; H01L 2225/0541; H01L 2225/06586; H01L 2225/06548; H01L 2221/68345; H01L 2221/68359; H01L 2221/68372; H01L 2221/68327; H01L 2924/1431; H01L 2924/1434; H01L 2924/182; H01L 25/18; H01L 25/16; H01L 25/0652; H01L 25/105; H01L 25/50; H01L 24/16; H01L 24/81; H01L 24/08; H01L 24/80; H01L 24/82

See application file for complete search history.

(56) References Cited

U.S. PATENT DOCUMENTS

| | | | |
|---|---|---|---|
| 11,171,076 B2 | 11/2021 | Yu et al. | |
| 2009/0267238 A1* | 10/2009 | Joseph | H01L 23/49833 438/109 |
| 2017/0162237 A1* | 6/2017 | Lee | G11C 7/1042 |
| 2017/0207197 A1 | 7/2017 | Yu et al. | |
| 2018/0006006 A1* | 1/2018 | Kim | H01L 24/33 |
| 2018/0157782 A1* | 6/2018 | Rossi | G06F 30/392 |
| 2020/0006089 A1 | 1/2020 | Yu et al. | |
| 2020/0098692 A1* | 3/2020 | Liff | H01L 23/5386 |
| 2020/0118908 A1 | 4/2020 | Yu et al. | |
| 2020/0161266 A1* | 5/2020 | Shim | H01L 23/147 |
| 2021/0143126 A1* | 5/2021 | Choi | H01L 25/0657 |
| 2021/0175161 A1* | 6/2021 | Park | H01L 23/49827 |

* cited by examiner

ARCHITECTURE FOR COMPUTING SYSTEM PACKAGE

PRIORITY CLAIM AND CROSS-REFERENCE

This application is a continuation of U.S. patent application Ser. No. 17/229,322, entitled "Architecture for Computing System Package," filed on Apr. 13, 2021, which claims the benefit of U.S. Provisional Application No. 63/137,375, filed on Jan. 14, 2021, and entitled "SoIC Technology for New Immersion in Memory Compute System Architecture," which applications are hereby incorporated herein by reference.

BACKGROUND

The packages of integrated circuits are becoming increasing complex, with more device dies integrated in the same package to achieve more functions. For example, system packages have been developed to include a plurality of device dies such as processors and memory cubes in the same package. In the system packages, device dies formed using different technologies and having different functions can be bonded in both 2D side-by-side and 3D stacking manner to form a system, which has high computing efficiency, high bandwidth, high functionality packing density, low communication latency, and low energy consumption per bit data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
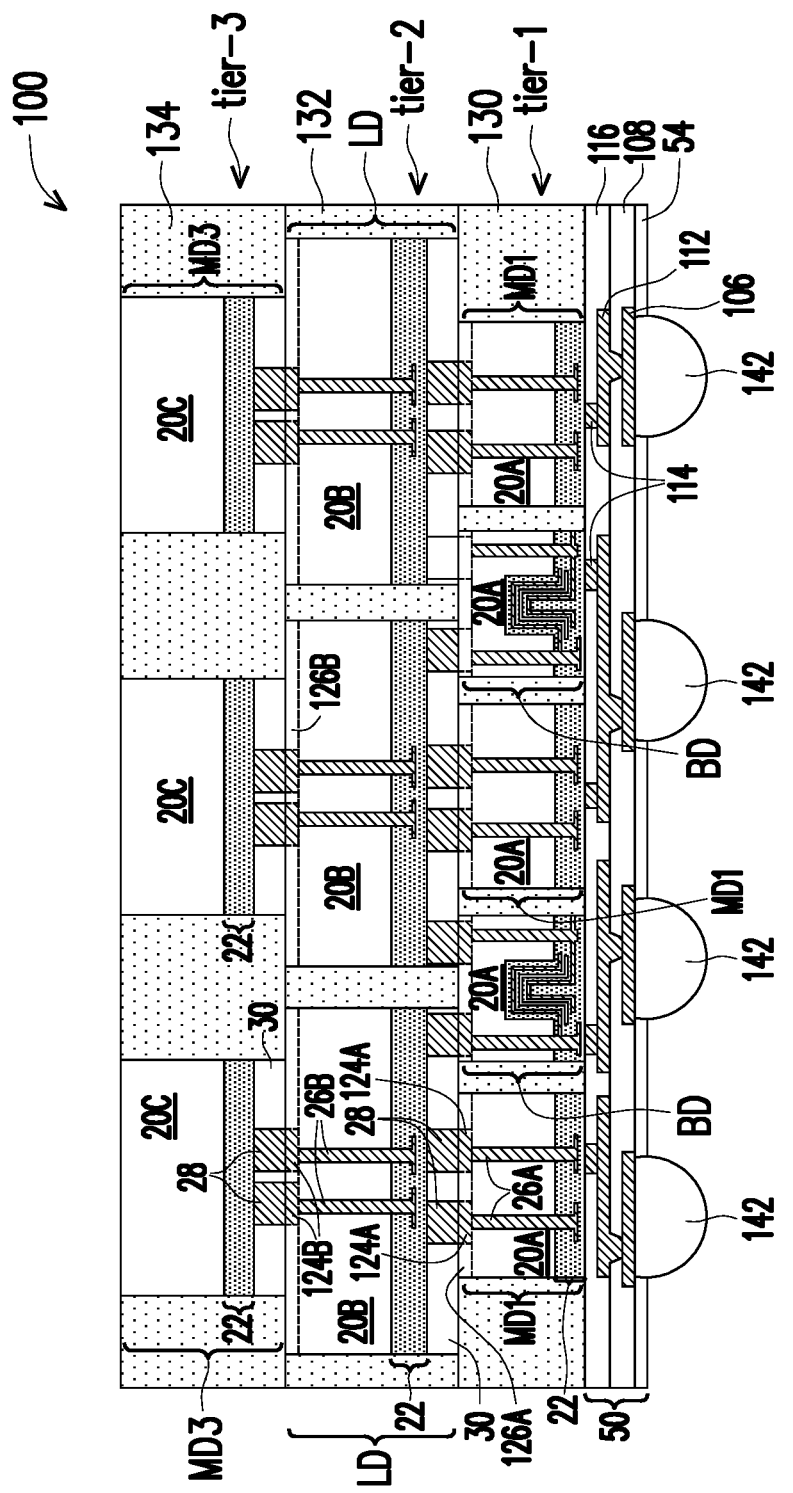
FIGS. 1A, 1B, 1C, 1D, 1E, 1F, and 1G illustrate the cross-sectional views, perspective views, and top and bottom views of a computing system package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A computing system package and the method of forming the same are provided in accordance with various embodiments. The computing system package may include three tiers, with the middle tier including logic dies, and the bottom tier and top tier including memory dies. Accordingly, logic dies have shortest paths to the memory dies they access. Bridge dies are in the bottom tier, and are used to interconnect logic dies. Each of the logic dies thus has maximized access to other logic dies and memory dies, without increasing the complexity of the system. Also, the scalability of the system is improved due to the adoption of arrays of logic dies, memory dies, and bridge dies. With this setting, the computing efficiency may be improved, the bandwidth of the system may be increased, and the latency may be reduced due to the close proximity of the memory dies and logic dies, and the efficient layout. The intermediate stages in the formation of the package are illustrated in accordance with some embodiments. Some variations of some embodiments are discussed. Throughout the various views and illustrative embodiments, like reference numbers are used to designate like elements.

FIGS. 1A, 1B, 1C, 1D, 1E, 1F, and 1G illustrate the cross-sectional views, perspective views and top and bottom views of a computing system package wo in accordance with some embodiments. The computing system package wo includes logic dies, memory dies, and bridge dies distributed in a plurality of tiers including tier-1, tier-2 and tier-3, which are encapsulated in encapsulant 130, 132, and 134, respectively. Tier-1 may include memory dies MD1 and bridge dies BD. Tier-2 may include logic dies LD. Tier-3 may include memory dies MD3. Logic dies LD perform computing functions, and the logic dies LD access memory dies MD1 and MD3. In the drawings of the present disclosure, the reference numbers of device dies may start with symbol "LD," symbol "MD," or symbol "BD." Symbol "LD" is used to represent that the corresponding die is a logic die. Symbol "MD1" is used to represent that the corresponding die is a memory die in tier-1, and symbol "MD3" is used to represent that the corresponding die is a memory die in tier-3. Memory dies MD1 and MD3 are collectively referred to as memory dies MD. Letter "BD" is used to represent that the corresponding die is a bridge die. In each of the tiers tier-1, tier-2 and tier-3, the number of logic dies and the number of memory dies may be more than illustrated. It is appreciated that although three-tier packages are shown as examples, the computing system packages may include more than three tiers such as four tiers, five tiers, or more, and the addition tiers may be under the illustrated tier-1, and/or over the illustrated tier-3.

In accordance with some embodiments of the present disclosure, the logic dies LD may be Application Processor (AP) dies, Graphics Processing Unit (GPU) dies, Field Programmable Gate Array (FPGA) dies, Application Specific Integrated Circuit (ASIC) dies, Input-Output (IO) dies, Network Processing Unit (NPU) dies, Tensor Processing Unit (TPU) dies, Artificial Intelligence (AI) engine dies, or the like.

In accordance with some embodiments of the present disclosure, the memory dies MD1 and MD3 may include Static Random Access Memory (SRAM) dies, Dynamic Random Access Memory (DRAM) dies, wide I/O memory dies, NAND memory dies, Resistive Random Access Memory (RRAM) dies, Magneto-resistive Random Access Memory (MRAM) dies, Phase Change Random Access Memory (PCRAM) dies, or the like, or other types of volatile or non-volatile memory dies. The memory dies may include, or may be free from, controllers therein. In the embodiments in which memory dies do not include controller, the controllers may be built in logic dies. The memory dies may also be in the form of single memory die or pre-stacked memory cubes.

In computing system package 100, and possibly in each of the tiers, different types of memory dies may be mixed. For example, tier-1 may adopt one type of memory dies as aforementioned, and tier-3 may adopt another type of memory dies. All of the memory dies in tier-1 may, however, be of the same type and are identical to each other, and the memory dies in tier-3 may be of the same type and are identical to each other in order to improve the scalability of the system, and to reduce the thickness of the package (since if different types are mixed, the thickness of the corresponding tier is determined by the thickest type). The logic dies LD in tier-2 may include different types of logic dies, which may include the aforementioned. Alternatively, all of the logic dies in tier-2 may be of the same type and identical to each other.

Tier-1 may include a plurality of memory dies MD1 and a plurality of bridge dies BD, and may be, or may not be, free from other types of dies such as logic dies, independent passive device dies, and the like. Tier-2 may include a plurality of logic die LD, and may be, or may not be, free from other types of dies such as memory dies, bridge dies, passive device dies, and the like. Tier-3 may include a plurality of memory dies MD3, and may be, or may not be, free from other types of dies such as logic dies, bridge dies, passive device dies, and the like.

Each of Logic dies LD, memory dies MD1/MD3, and bridge dies BD may include semiconductor substrates 20A, 20B, or 20C, which may be silicon substrates. Interconnect structures 22 are formed on the corresponding semiconductor substrates 20A/20B/20C, and are used to interconnect the devices in the corresponding dies. Through-substrate vias 26A and 26B may be formed to penetrate through the corresponding semiconductor substrates 20 of the tier-1 dies and tier-2 dies, and are used for the interconnection of the overlying components to the underlying components. Furthermore, electrical connectors 28 may be formed for bonding to other device dies. Electrical connectors 28 are used for the bonding between the dies in different tiers, and may be metal pads, metal pillars, solder regions, or the like. In accordance with some embodiments, electrical connectors 28 are metal pillars (such as copper pillars), and are in the corresponding surface dielectric layers 30. In accordance with some embodiments, surface dielectric layers 30 are formed of or comprise silicon oxide. In accordance with other embodiments, surface dielectric layers 30 include a polymer such as polybenzoxazole (PBO), polyimide, benzocyclobutene (BCB), or the like. Throughout the description, the side of semiconductor substrate 20 having interconnect structure 22 (and active device such as transistors, not shown) are referred to as a front side (or "face"), and the opposite side is referred to as a backside (or "back"). Accordingly, depending on which sides of the dies are bonded to each other, the bonding may be face-to-back bonding, face-to-face bonding, back-to-back bonding. For example, in FIG. 1A, face-to-back bonding is adopted.

Further referring again to FIG. 1A, 1F, or 1G, neighboring tiers are bonded to each other, either through direct metal-to-metal bonding, solder bonding, or hybrid bonding. Hybrid bonding includes both dielectric-to-dielectric bonding (also known as fusion bonding, in which Si—O—Si bonds may be formed between two bonded dielectric layers).

Underlying tier-1 dies may have an interconnect structure (redistribution structure) 50. Redistribution structure 50 may include dielectric layers 54, 108 and 116, RDLs 106 and 112, and Under-Bump Metallurgies (UBMs) 114. Electrical connectors 142, which may include solder regions, metal pillars, micro-bumps, or the like, are formed at the bottom surface of redistribution structure 50.

Figure 1B:
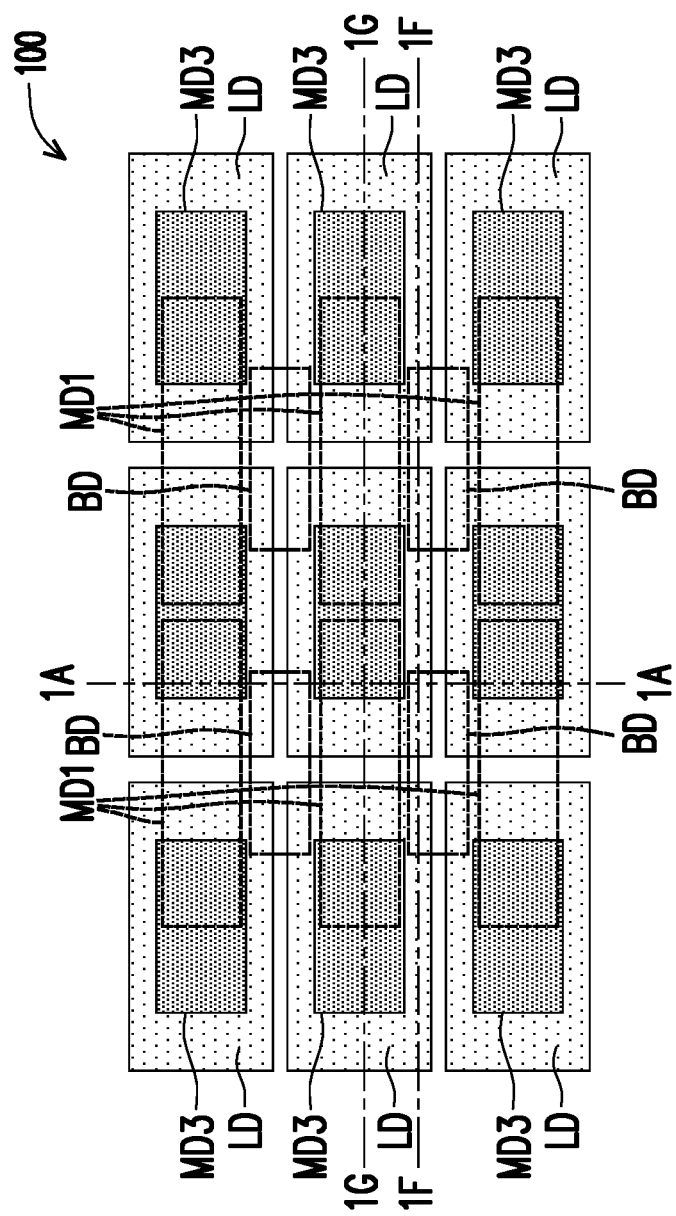
Figure 1C:
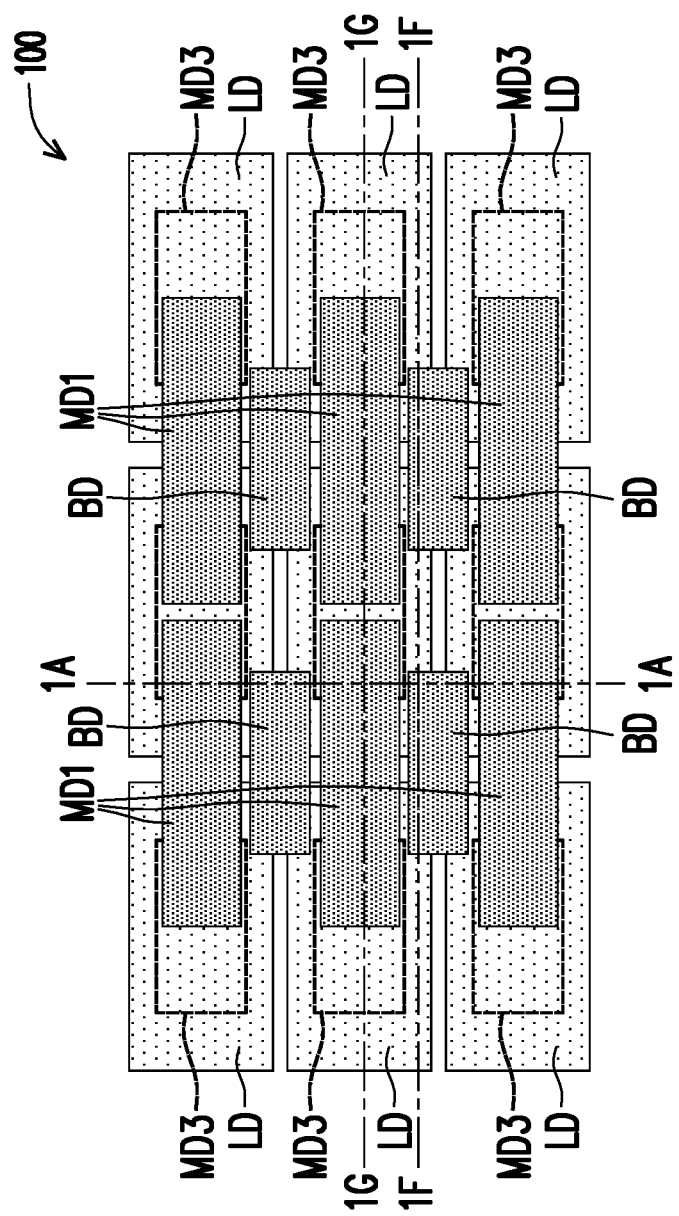

FIGS. 1B and 11C illustrate a top view and a bottom view, respectively, of the computing system package 100 as shown in FIG. 1A. The cross-sections of the computing system package 100 may be found referring to FIGS. 1A, 1F, and 1G, with FIG. 1A illustrating reference cross-section 1A-1A in FIGS. 1B and 1C, FIG. 1F illustrating reference cross-section 1F-1F in FIGS. 1B and 1C, and FIG. 1G illustrating reference cross-section 1G-1G in FIGS. 1B and 1C. As shown in FIG. 1B, memory dies MD1 and bridge dies BD are illustrated as being dashed since they are under logic dies LD. In accordance with some embodiments, memory dies MD3 may be arranged as an array. Logic dies LD may be arranged as an array. Bridge dies BD may be arranged as an array, and memory dies MD1 may also be arranged as an array. Although 3×3 arrays are illustrated as an example, larger arrays may be formed. Forming device dies as arrays has the advantageous feature of high scalability. This is particularly useful for increasing the computing power through adding more logic dies, memory dies, and bridge dies. As will be discussed in subsequent paragraphs, the co-operation of the logic dies may be achieved through sharing memory dies, and interacting through bridge dies, so that scaling up the system and increasing the computing power may be easily achieved by enlarging the device arrays.

In accordance with some embodiments, all of logic dies LD are identical to each other. In accordance with alternative embodiments, some logic dies LD are identical to each other, and are different from other logic dies LD, which are also identical to each other. For example, a first plurality of logic dies LD may be identical to each other, and a second plurality of logic dies LD may be identical to each other, and are different from the first plurality of logic dies LD. The first and the second plurality of logic dies LD may be laid out in an alternating layout, for example, alternating in each of the rows and columns of the array.

In accordance with some embodiments, each of memory dies MD3 is bonded to, and signally accessed by, one of logic dies LD. Each of memory dies MD1 is bonded to, and signally accessed by, two neighboring logic dies LD, which are also illustrated in FIG. 1G. With this layout, each logic die may access three memory dies directly without having routing lines in between. This significantly increases the amount of memory accessed by logic dies without increasing the power consumption and latency.

Further referring to FIGS. 1B and 1C, each of bridge dies BD is bonded to, and interconnects, four logic dies LD. Bridge dies BD are used for the intercommunication of the four connecting logic dies with each other. For example, bridge dies BD may include conductive lines therein, which directly interconnect each pair of the four logic dies LD. Bridge dies BD may also include networking circuits (and hence may be a networking-on-chip die), which include switches, router circuits, or the like, for switching signals between each pair of the four logic dies. Accordingly, through the bridge dies BD, all four logic dies LD may function as an integrated system. Furthermore, each of the logic dies LD is connected to four bridge dies, and hence can route signals from any of the four bridge dies to the other. Accordingly, all of the logic dies LD may work with each other (through bridge dies BD) to form an integrated computing system, and to achieve parallel computing. As can be conceived from FIGS. 1B and 1C, the computing system package 100 can be scaled up to increase computing power by replicating and enlarging the arrays of logic dies LD, memory dies MD1 and MD3, and bridge dies BD.

Figure 1D:
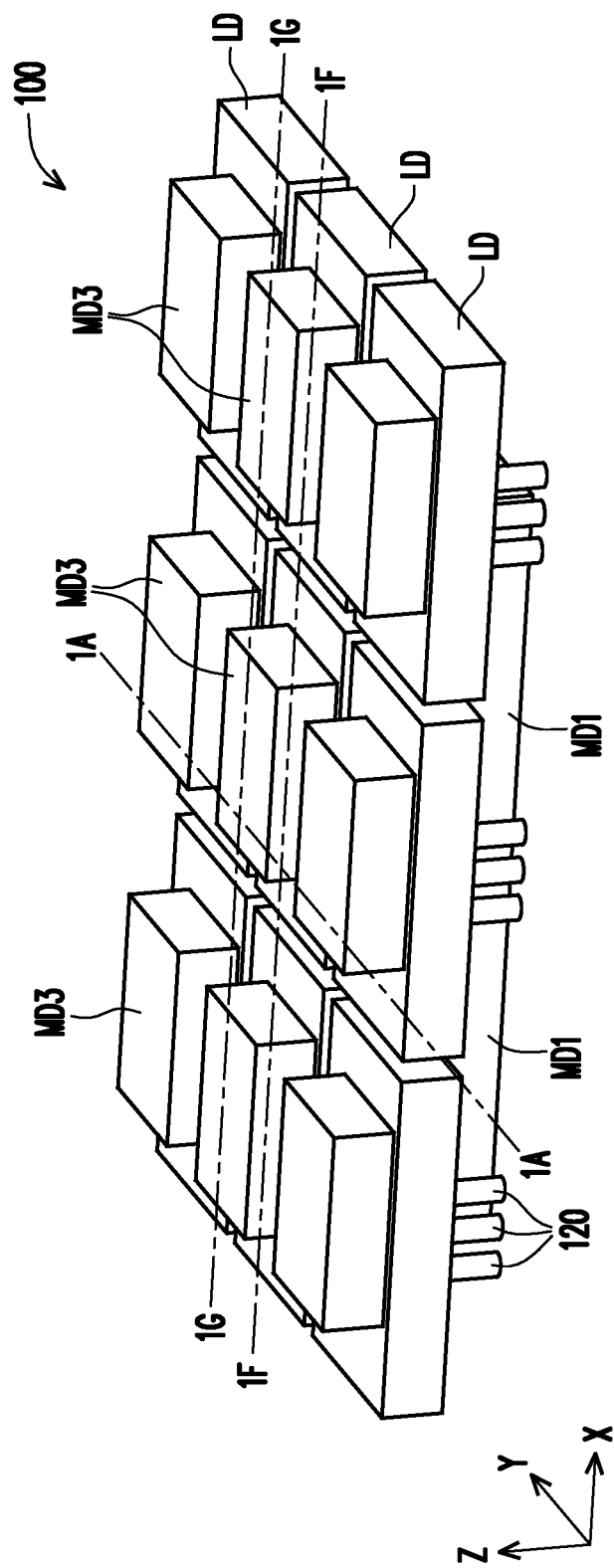
Figure 1E:
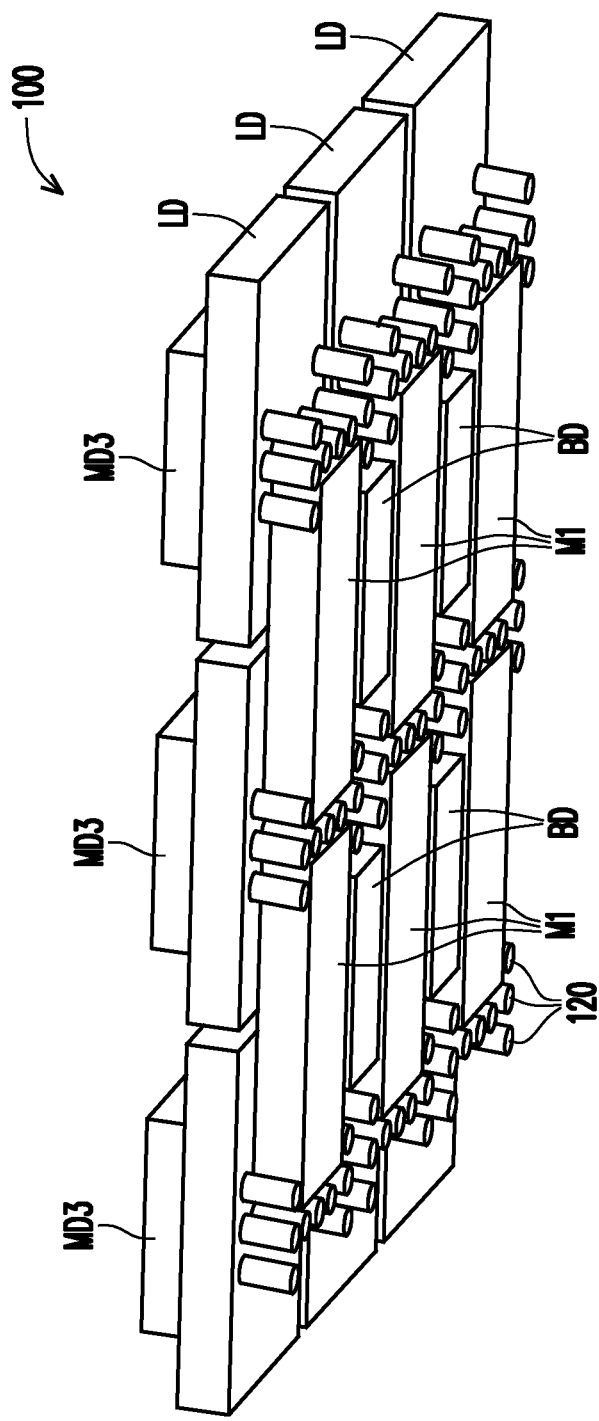
Figure 1F:
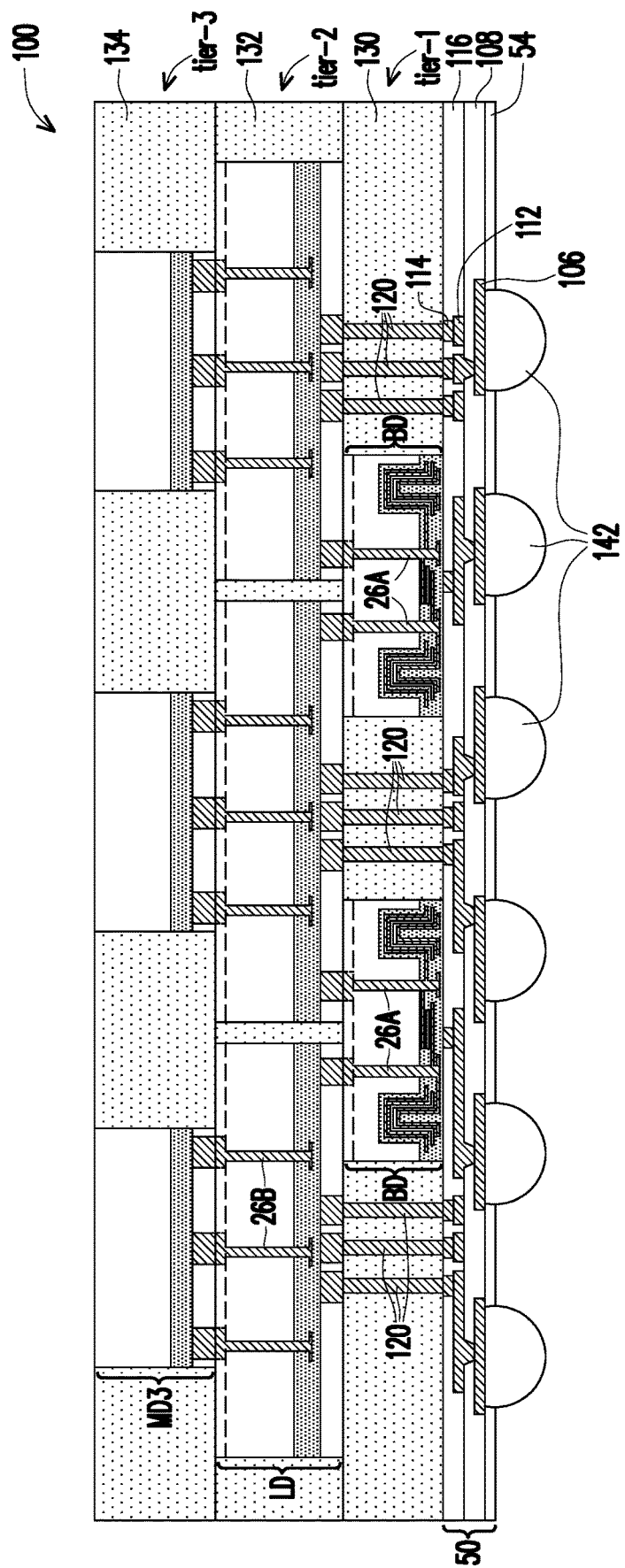
Figure 1G:
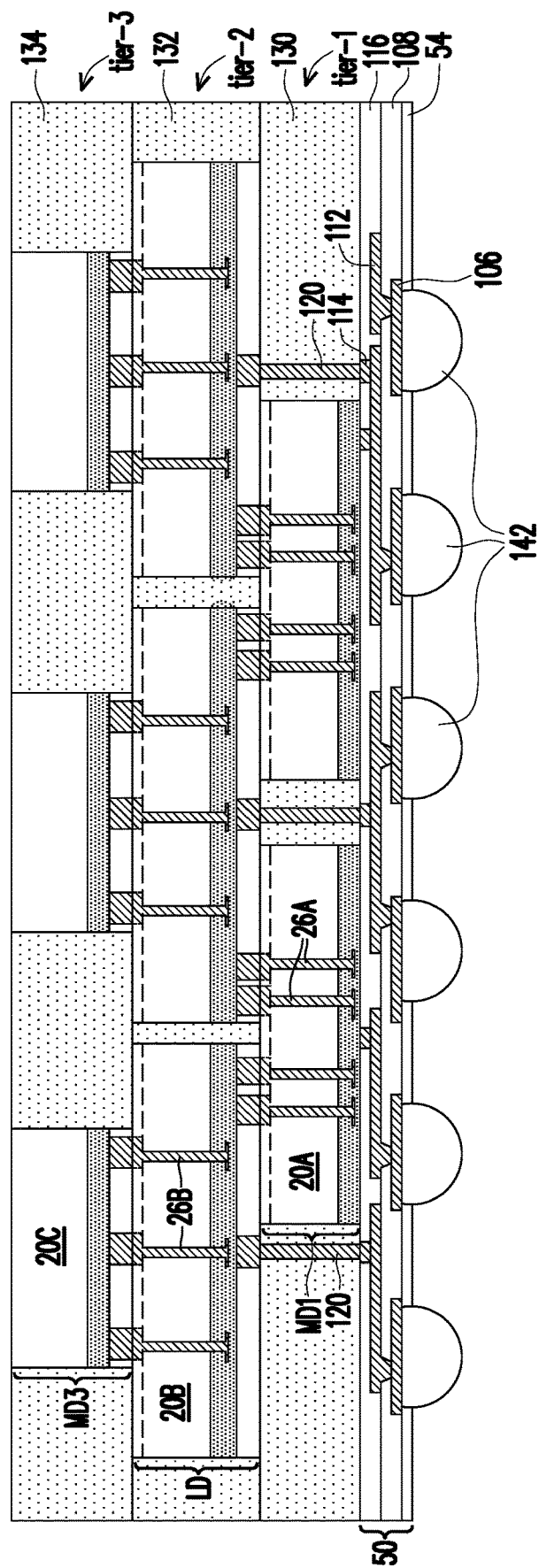

FIGS. 1D and 1E illustrate the perspective views of computing system package 100 in accordance with some embodiments, FIG. 1D illustrates a perspective view from top side, and FIG. 1E illustrates a perspective view from bottom side.

FIG. 1F illustrates the reference cross-section 1F-1F as shown in FIGS. 1B and 1C. Memory dies MD1 are not illustrated in FIG. 1F since memory dies MD1 are not in the illustrated cross-section. The two logic dies LD connected to the same bridge die BD are illustrated, while the other two logic dies LD connecting to the same bridge die BD are not illustrated since they are not in the illustrated cross-section.

Figure 25:
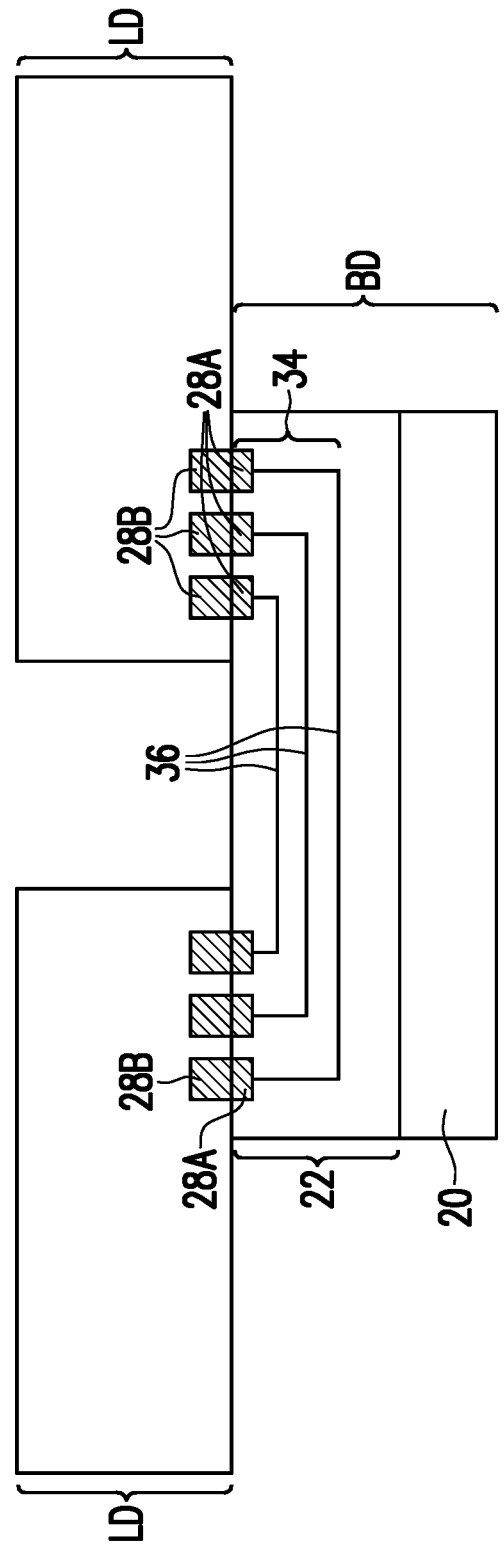
FIG. 25 illustrates a part of an interconnect structure in a bridge die in accordance with some embodiments.

FIG. 25 schematically illustrates a bridge die BD, which includes bridging structure 34 for interconnecting logic dies LD. In accordance with some embodiments, bridging structure 34 is formed in interconnect structure 22 of bridge die BD. For example, interconnect structure 22 may include dielectric layers (sometimes referred to as Inter-Metal Dielectrics (IMDs)), which may include low-k dielectric materials. Bridging structure 34 may include metal lines and vias, which may extend into a plurality of metallization layers in interconnect structure 22. The metal lines and vias are interconnected to form a plurality of electrical paths 36, with opposing ends of each of electrical paths 36 connecting to an electrical connector 28A, which may include a metal pad, a metal pillar, a solder region, or the like. Logic dies LD have electrical connectors 28B, which are bonded to electrical connectors 28A. Bridging structure 34 may also include digital switches, routers, or the like, which may include the electrical paths, and switches (which include active device such as transistors and control circuits).

Figure 26:
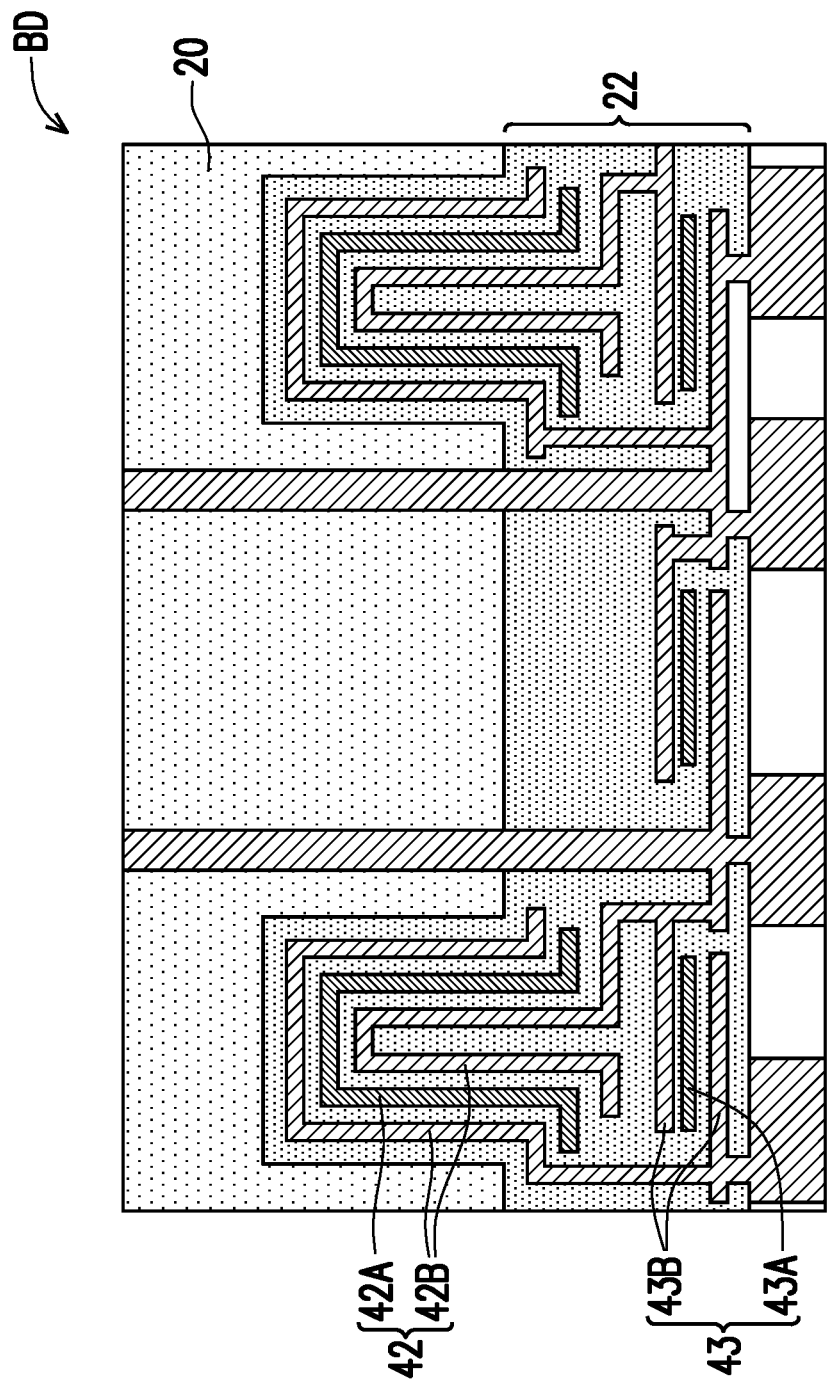
FIG. 26 illustrates the capacitors in a bridge die in accordance with some embodiments.

Referring back to FIG. 1F, bridge dies BD may also include passive devices 42/43 such as capacitors, resistors, inductors, or the like. FIG. 26 illustrates an example bridge die BD. In accordance with some embodiments, bridge die BD includes deep trench capacitor 42 and/or Metal-Insulator-Metal (MIM) capacitor 43. Deep trench capacitor 42 may include capacitor electrodes 42B and insulator 42A between capacitor electrodes 42B, with deep trench capacitor 42 extending into a trench formed in semiconductor substrate 20, so that the capacitance may be increased. MIM capacitor 43 may include capacitor electrodes 43B and insulator 43A between capacitor electrodes 43B, and may be formed in the interconnect structure 22 in bridge die BD. In accordance with some embodiments, MIM capacitor 43 and the electrical paths 36 (FIG. 25) extend into the same interconnect structure 22 in bridge die BD.

FIG. 1G illustrates the reference cross-section 1G-1G as shown in FIGS. 1B and 1C. Bridge dies BD are not illustrated in FIG. 1G since bridge dies BD are not in the illustrated cross-section.

As shown in FIGS. 1A, 1F, and 1G, through-substrate vias 26A are formed in memory dies MD1 and bridge dies BD, and penetrate through the semiconductor substrates 20A of memory dies MD1 and bridge dies BD. Through-substrate vias 26A are used to electrically and signally couple redistribution structure 50 to logic dies LD. As shown in FIGS. 1F, and 1G, through-vias 120 (through-molding vias) are formed to penetrate through encapsulant 130, and are used to electrically and signally couple redistribution structure 50 to logic dies LD.

FIGS. 2 through 14 illustrate the cross-sectional views of intermediate stages in the formation of computing system packages 100 as shown in FIGS. 1A, 1B, 1C, 1D, 1E, 1F, and 1G in accordance with some embodiments of the present disclosure. In accordance with some embodiments, as shown in FIGS. 2 through 14, an RDL-first (with "RDL" representing "redistribution line") approach is adopted, with redistribution structure 50 (FIG. 1A) being formed before placing and bonding dies. The corresponding processes are also reflected schematically in the process flow shown in FIG. 28. In accordance with alternative embodiments, an RDL-last approach may be adopted, with the dies placed and bonded first, and then redistribution structure 50 is formed.

Figure 2:
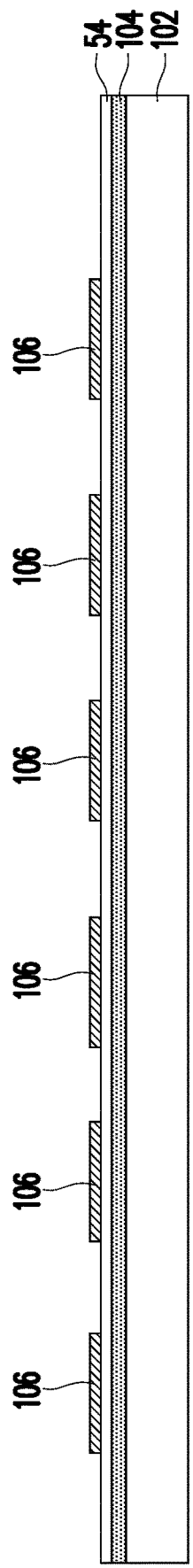
FIGS. 2 through 14 illustrate the cross-sectional views of intermediate stages in the formation of computing system packages in accordance with some embodiments.

FIG. 2 illustrates carrier 102 and release film 104 formed on carrier 102. Carrier 102 may be a glass carrier, a silicon wafer, an organic carrier, or the like. Carrier 102 may have a round top-view shape in accordance with some embodiments. Release film 104 may be formed of a polymer-based material (such as a Light-To-Heat-Conversion (LTHC) material), which is capable of being decomposed under heat-carrying radiation such as a laser beam, so that carrier 102 may be de-bonded from the overlying structures that will be formed in subsequent processes. In accordance with some embodiments of the present disclosure, release film 104 is formed of an epoxy-based thermal-release material, which is coated onto carrier 102.

A plurality of dielectric layers and a plurality of RDLs are formed over the release film 104, as shown in FIGS. 2 through 5. Referring to FIG. 2, dielectric layer 54 is formed on release film 104. In accordance with some embodiments of the present disclosure, dielectric layer 54 is formed of a polymer, which may also be a photo-sensitive material such as polybenzoxazole (PBO), polyimide, benzocyclobutene (BCB), or the like, that may be patterned using a photo lithography process including a light-exposure process and a development process.

Figure 28:
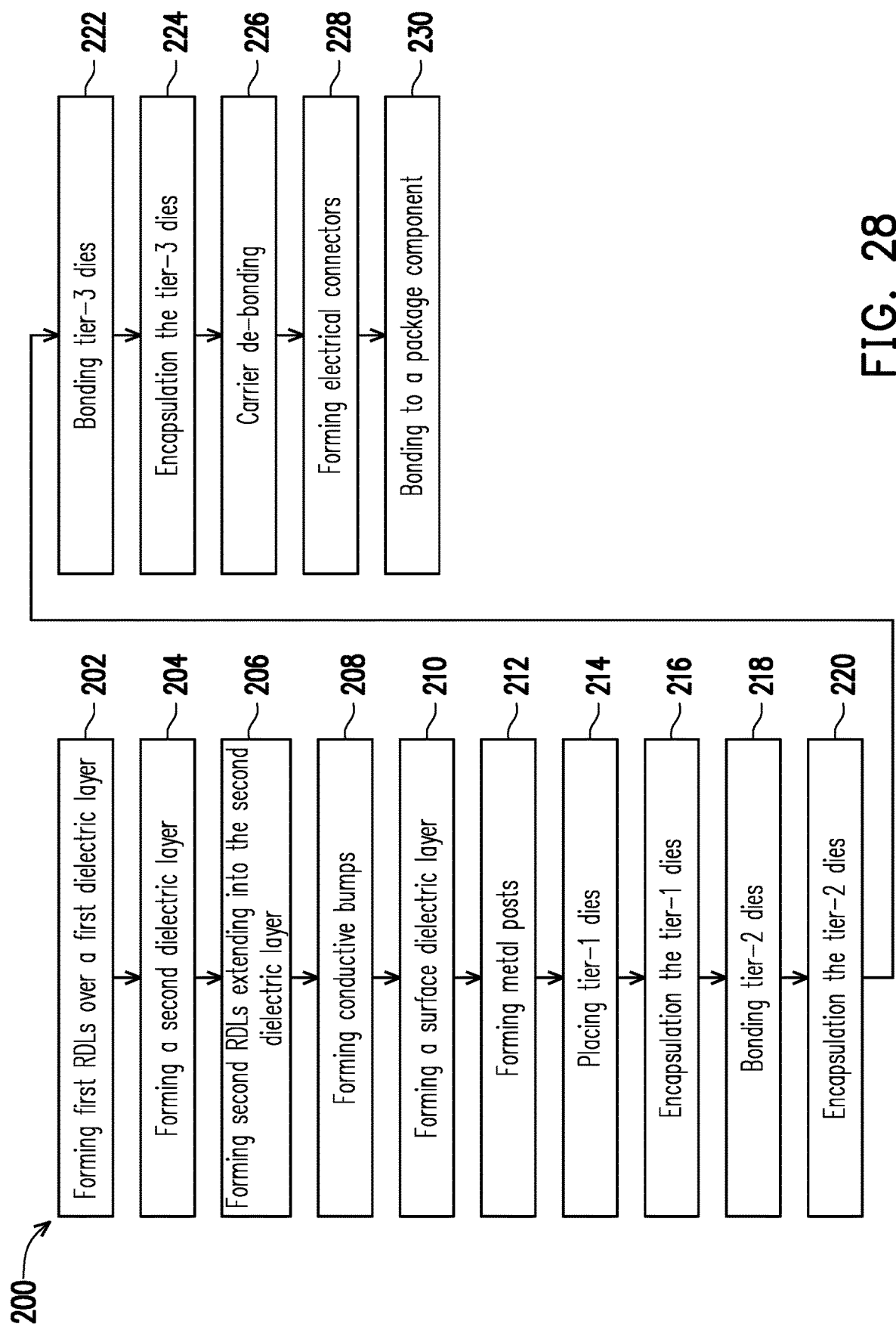
FIG. 28 illustrates a process flow for forming a computing system package in accordance with some embodiments.

Redistribution Lines (RDLs) 106 are formed over dielectric layer 54 in accordance with some embodiments. The respective process is illustrated as process 202 in the process flow 200 as shown in FIG. 28. The formation of RDLs 106 may include forming a metal seed layer (not shown) over dielectric layer 54, forming a patterned mask (not shown) such as a photo resist over the metal seed layer, and then performing a metal plating process on the exposed seed layer. The patterned mask and the portions of the seed layer covered by the patterned mask are then removed, leaving RDLs 106 as shown in FIG. 2. In accordance with some embodiments of the present disclosure, the seed layer includes a titanium layer and a copper layer over the titanium layer. The seed layer may be formed using, for example, Physical Vapor Deposition (PVD) or a like process. The plating may be performed using, for example, an electrochemical plating process or an electro-less plating process.

Figure 3:
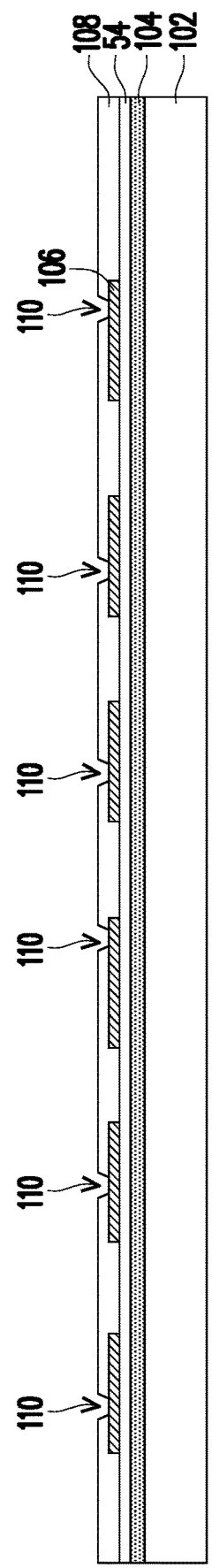

Referring to FIG. 3, dielectric layer 108 is formed on RDLs 106. The respective process is illustrated as process 204 in the process flow 200 as shown in FIG. 28. The bottom surface of dielectric layer 108 is in contact with the top surfaces of RDLs 106 and dielectric layer 54. In accordance with some embodiments of the present disclosure, dielectric layer 108 is formed of a polymer, which may be a photo-sensitive material such as PBO, polyimide, BCB, or the like. Alternatively, dielectric layer 108 may include a non-organic dielectric material such as silicon oxide, silicon nitride, silicon carbide, silicon oxynitride, or the like. Dielectric layer 108 is then patterned to form openings no therein. Some portions of RDLs 106 are exposed through the openings 110 in dielectric layer 108.

Figure 4:
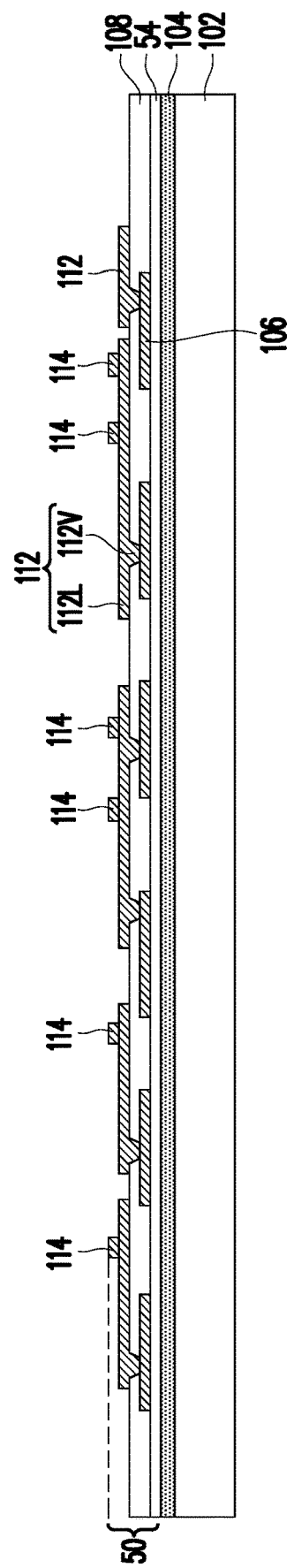

Next, referring to FIG. 4, RDLs 112 are formed to connect to RDLs 106. The respective process is illustrated as process 206 in the process flow 200 as shown in FIG. 28. RDLs 112 include metal traces (metal lines) over dielectric layer 108. RDLs 112 also include vias extending into the openings no in dielectric layer 108. RDLs 112 may also be formed through a plating process, wherein each of RDLs 112 includes a seed layer (not shown) and a plated metallic material over the seed layer. In accordance with some embodiments, the formation of RDLs 112 may include depositing a blanket metal seed layer extending into the via openings, and forming and patterning a first plating mask (such as photo resist), with openings formed over and joining the via openings. A plating process is then performed to plate a metallic material, which fully fills the via openings no (FIG. 3), and has some portions higher than the top surface of dielectric layer 108. The first plating mask is then removed.

The metal seed layer and the plated material may be formed of the same material or different materials. The metallic material in RDLs 112 may include a metal or a metal alloy including copper, aluminum, tungsten, or alloys thereof. RDLs 112 include RDL lines (also referred to as traces or trace portions) 112L and via portions (also referred to as vias) 112V, wherein trace portions 112L are over dielectric layer 108, and via portions 112V are in dielectric layer 108. Since trace portions 112L and via portions (also referred to as vias) 112V are formed in a same plating process, there is no distinguishable interface between vias 112V and the corresponding overlying trace portions 112L. Also, each of vias 112V may have a tapered profile, with the upper portions wider than the corresponding lower portions.

Further referring to FIG. 4, conductive bumps 114 are formed on RDLs 112. The respective process is illustrated as process 208 in the process flow 200 as shown in FIG. 28. It is appreciated that although one layer of RDLs is illustrated in the example embodiments as shown, there may be more layers of RDLs formed over and electrically connecting to the layers of RDLs 112. The subsequent formation process is related to the bonding scheme for bonding device dies MD1 (FIG. 7) and BD (FIG. 1A), and related to whether device dies are placed facing down or facing up, and whether solder bonding, direct metal-to-metal bonding, or hybrid bonding is used. Accordingly, although one formation process is discussed as an example, other formation processes and structures are in the scope of the present disclosure.

In accordance with some embodiments, conductive bumps 114 are plated using a second plating mask, and may be plated using a same metal seed layer as for plating RDLs 112. Conductive bumps 114 may comprise copper, nickel, gold, or the like. After conductive bumps 114 are plated, the second plating mask is removed, followed by an etching process to remove the exposed portions of the metal seed layer, which was previously covered by the second plating mask and the first plating mask. The remaining portions of the metal seed layer are also considered as being parts of RDLs 112. Redistribution structure 50 is thus formed.

Figure 5:
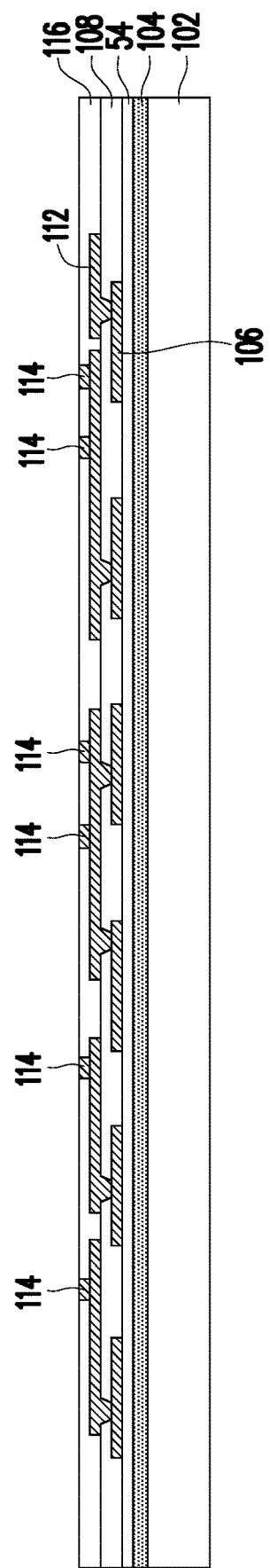

Next, as shown in FIG. 5, dielectric layer 116 is formed. The respective process is illustrated as process 210 in the process flow 200 as shown in FIG. 28. A planarization process may be performed to level the top surfaces of conductive bumps 114 and dielectric layer 116. When hybrid bonding is to be performed, dielectric layer 116 may comprise a silicon-containing dielectric material such as silicon oxide. In accordance with alternative embodiments, conductive bumps 114 may be formed after the formation of dielectric layer 116, and the formation process may include forming openings in dielectric layer 116 to reveal the underlying RDLs 112, and then forming conductive bumps 114. The corresponding dielectric layer 116 may comprise an organic material such as PBO, polyimide, BCB, or the like, or an inorganic dielectric material such as silicon oxide, silicon nitride, silicon oxynitride, or the like. The formation process also include forming a metal seed layer, forming a plating mask, plating a metallic material, removing the plating mask, and then etching undesirable portions of the metal seed layer.

Figure 6:
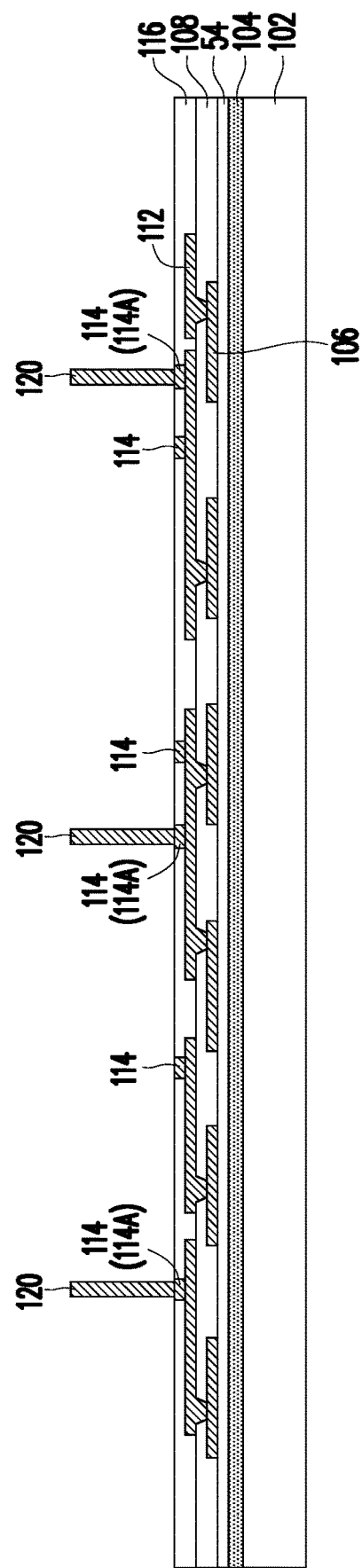

Next, as shown in FIG. 6, metal posts 120 are formed. The respective process is illustrated as process 212 in the process flow 200 as shown in FIG. 28. The formation process may include forming a metal seed layer, forming a plating mask (not shown, may be a photo resist) over the metal seed layer, patterning the plating mask to reveal the underlying metal seed layer, and then plating a metallic material in the openings in the plating mask. Metal posts 120 are alternatively referred to as through-vias or through-molding vias since they will penetrate through the subsequently formed encapsulating material (which may be a molding compound). The plated metallic material may be copper or a copper alloy. Metal posts 120 may have substantially vertical and straight edges. In accordance with alternative embodiments, conductive bumps 114A are not formed in the preceding processes. Rather, they are formed in the same process for forming metal posts 120.

Figure 7:
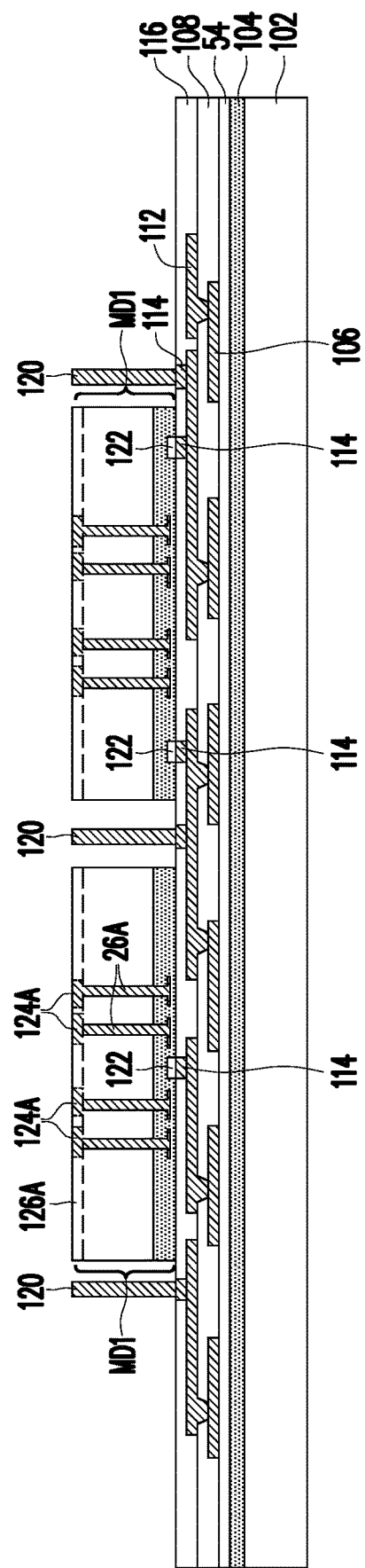

FIG. 7 illustrates the placement/attachment of tier-1 dies, which includes memory dies MD1 and bridge dies BD (also refer to FIG. 1A). The respective process is illustrated as process 214 in the process flow 200 as shown in FIG. 28.

Figure 16A:
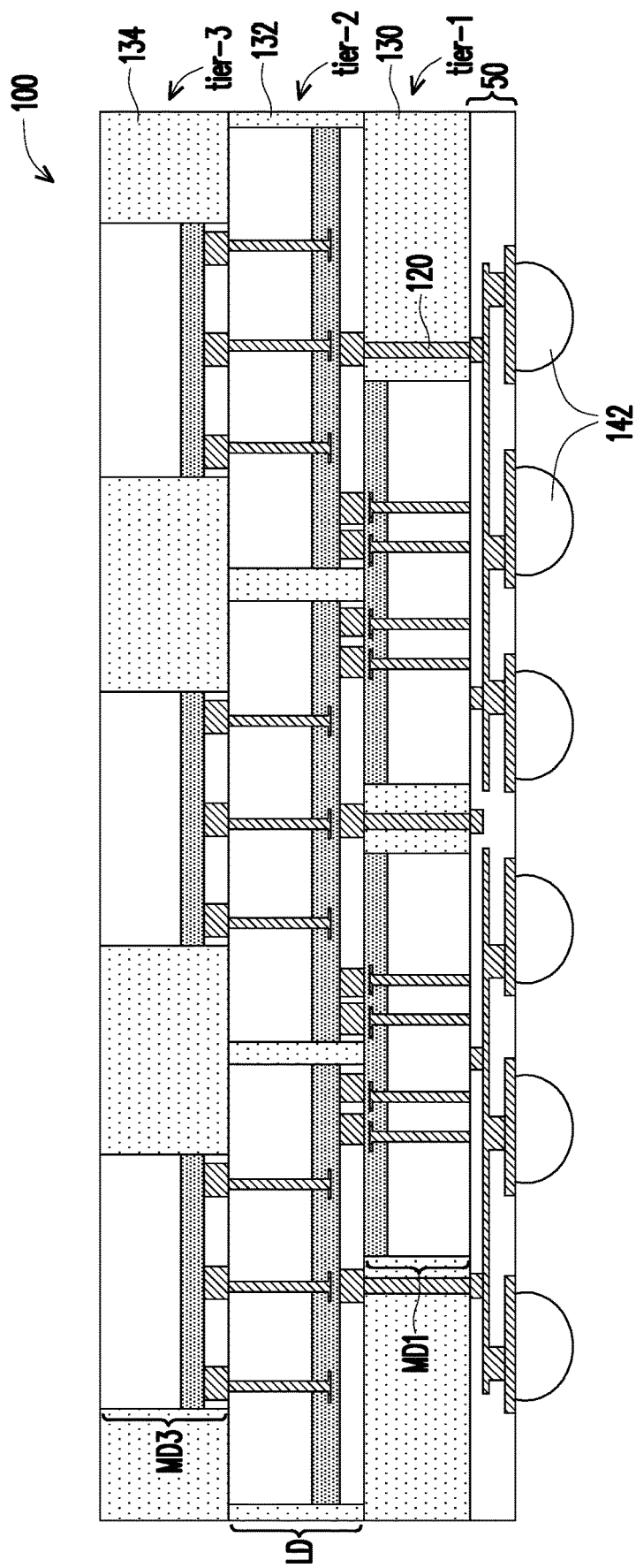
Figure 16B:
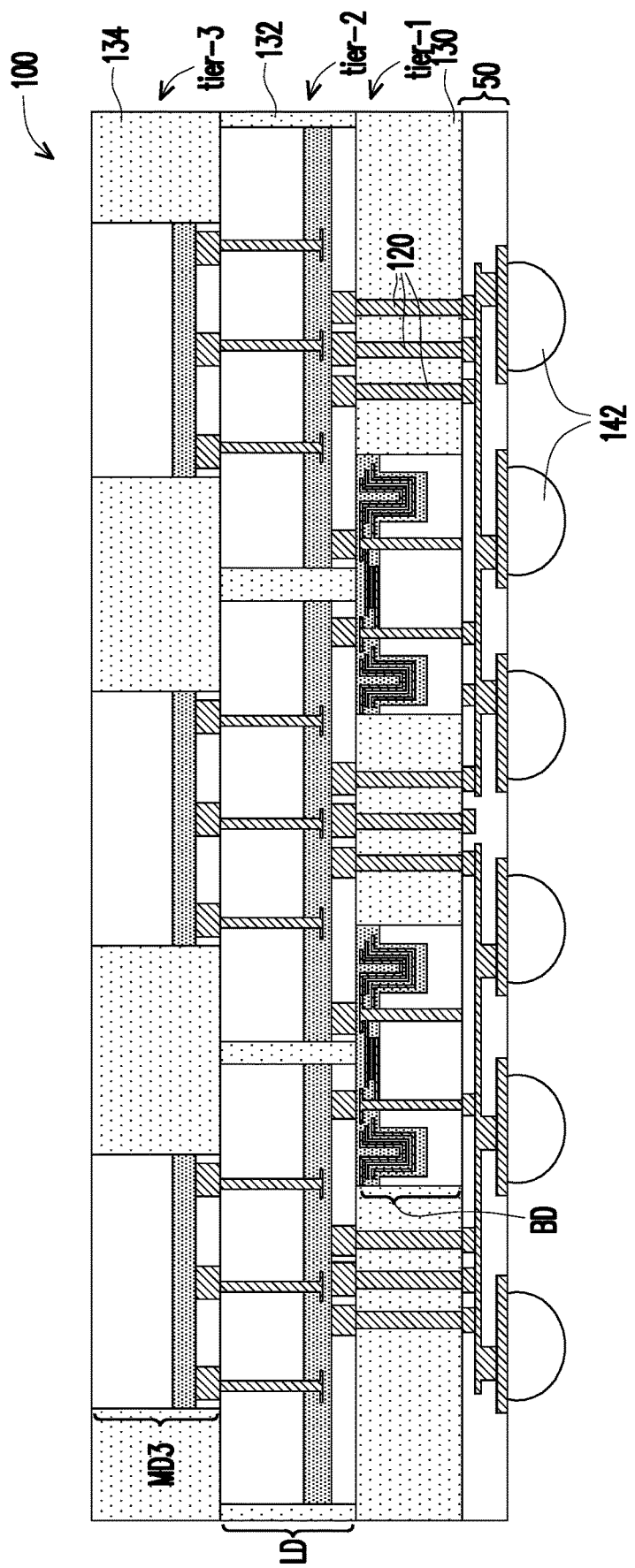
Figure 16C:
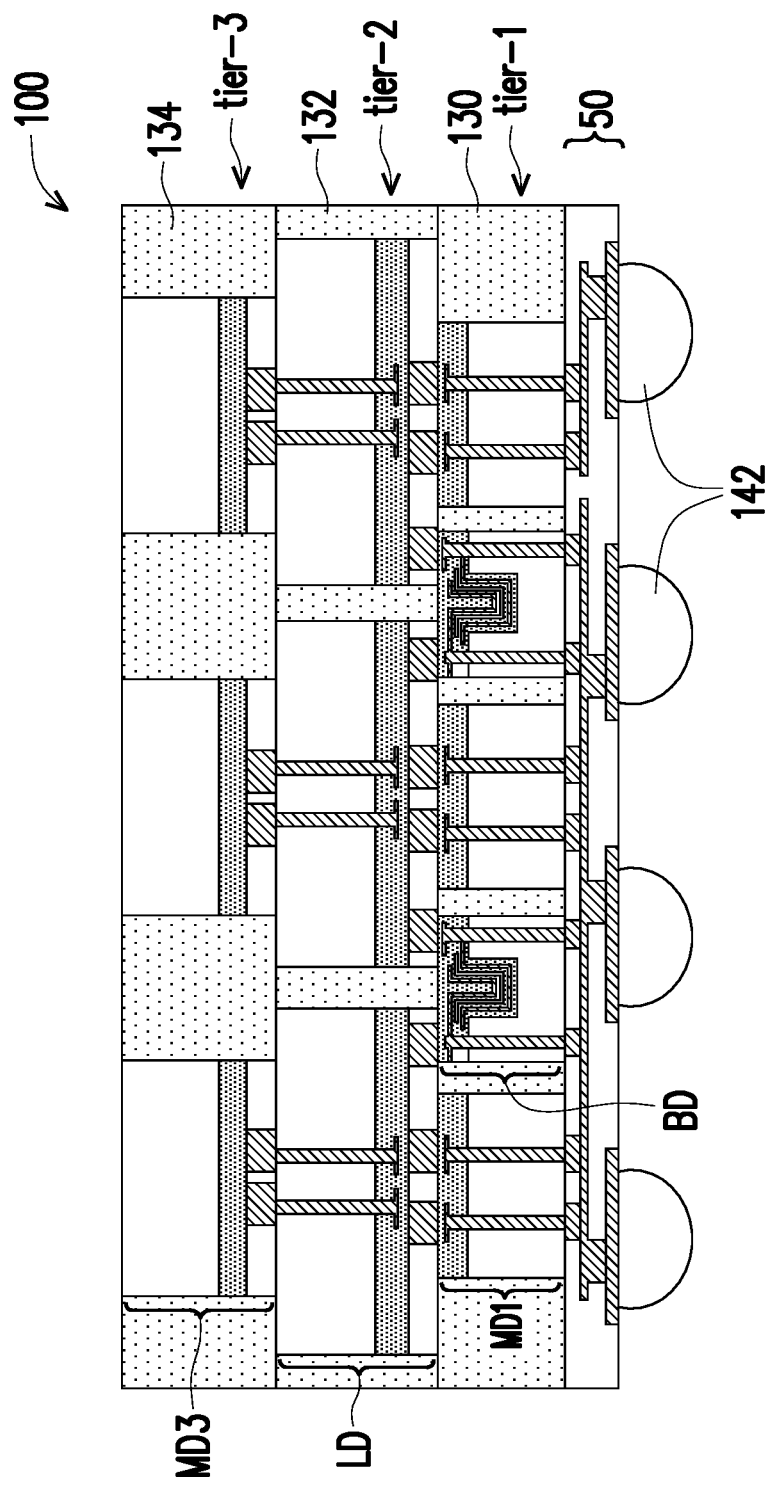

Bridge dies BD are in an un-illustrated cross-section, and hence are not shown in FIG. 7. In accordance with some embodiments, tier-1 dies MD1 and BD faces down, and the electrical connectors 122 in the tier-1 dies MD1 and BD are bonded to conductive bumps 114. In accordance with alternative embodiments, for example, as shown in FIGS. 16A, 16B, and 16C, dies MD1 and BD may face up, and the electrical connectors on the backside of device dies MD1 and BD are bonded to conductive bumps 114.

Memory dies MD1 and bridge dies BD may have electrical connectors 124A (such as metal pads, metal bumps, or the like) pre-formed as portions of the respective device die. Electrical connectors 124A are on the backside of the respective dies. Dielectric layer 126A may also be formed on the back surface of memory dies MD1 and bridge die BD. In accordance with alternative embodiments, electrical connectors 124A are not pre-formed in memory dies MD1 and bridge dies BD. Rather, through-substrate vias 26A extend to an intermediate level between a top surface and back surface of semiconductor substrate 20, and the electrical connectors are formed after memory dies MD1 and bridge die BD are encapsulated, and formed between the process shown in FIG. 8 and the process shown in FIG. 9.

Figure 8:
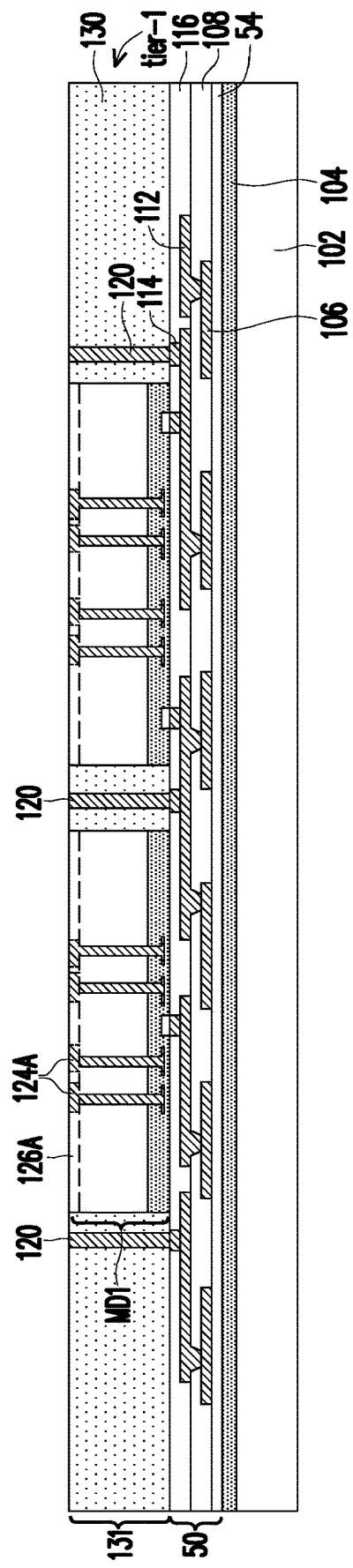

Next, tier-1 dies MD1 and BD and metal posts 120 are encapsulated in encapsulant 130, as shown in FIG. 8. The respective process is illustrated as process 216 in the process flow 200 as shown in FIG. 28. Encapsulant 130 fills the gaps between neighboring through-vias 120 and tier-1 dies MD1 and BD. Encapsulant 130 may include a molding compound, a molding underfill, an epoxy, and/or a resin. When formed of molding compound, encapsulant 130 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters.

A planarization process such as a Chemical Mechanical Polish (CMP) step or a mechanical grinding step is then performed to thin encapsulant 130, until through-vias 120 and tier-1 dies MD1 and BD are exposed. Due to the planarization process, the top ends of through-vias 120 are substantially level (coplanar) with the top surfaces of electrical connectors 124A (if pre-formed), and are substantially coplanar with the top surface of encapsulant 130. Throughout the description, tier-1 dies and encapsulant 130 are collectively referred to reconstructed wafer 131.

Figure 9:
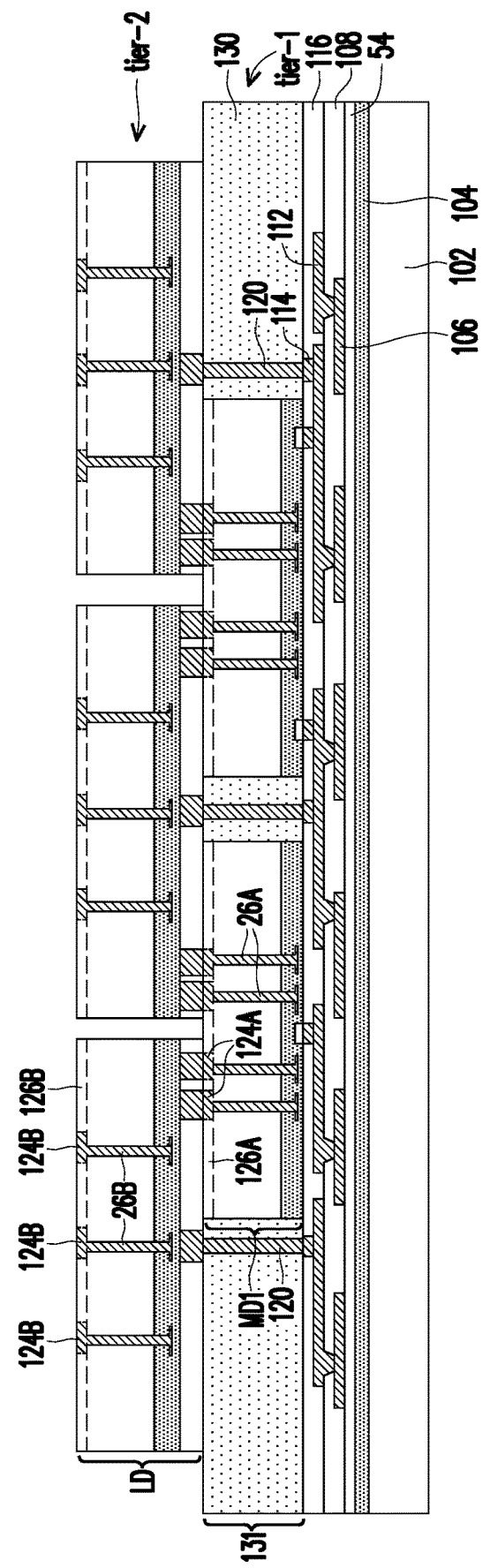

Referring to FIG. 9, tier-2 dies LD are bonded to tier-1 dies MD1 and BD and through-vias 120 (and to reconstructed wafer 131). The respective process is illustrated as process 218 in the process flow 200 as shown in FIG. 28. In the illustrated example embodiments, tier-2 dies LD are bonded to tier-1 dies MD1 and BD and through-vias 120 directly, with no RDLs therebetween. In accordance with alternative embodiments, an additional fan-out redistribution structure (not shown) including dielectric layers and RDLs may be formed on and connecting to tier-1 dies MD1 and BD and through-vias 120, and tier-2 dies LD are bonded to the additional fan-out redistribution structure. Similar to tier-1 dies, electrical connectors 12413 and dielectric layers 12613 may be pre-formed in tier-2 dies LD, or may be formed in another additional fan-out redistribution structure over tier-2 dies LD.

Figure 10:
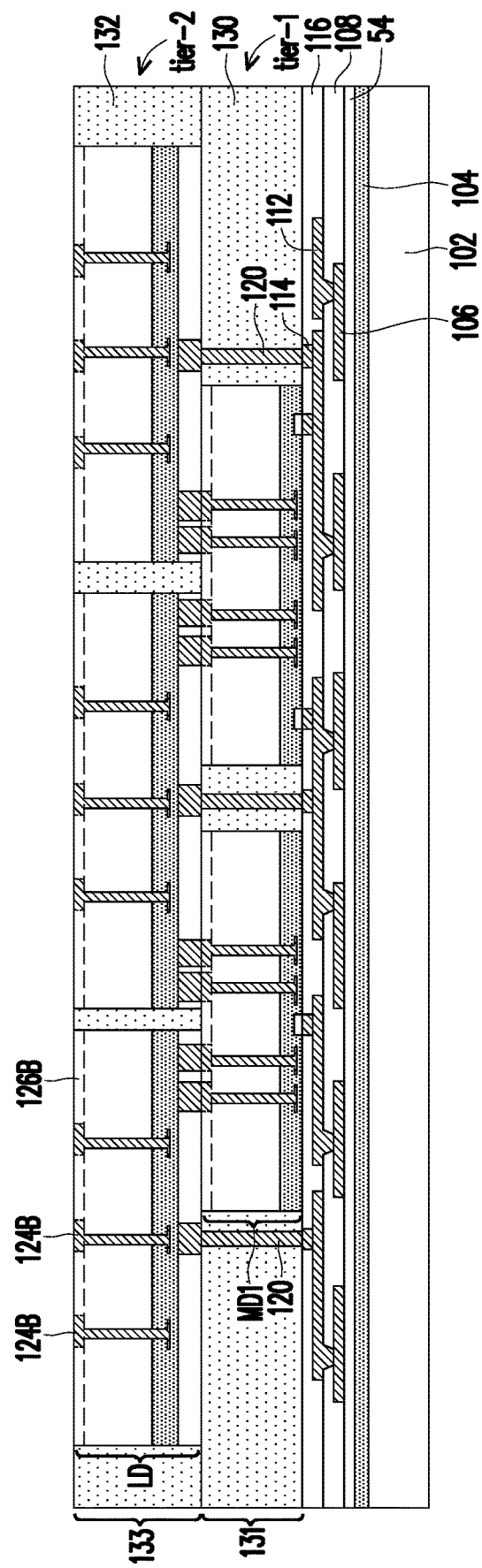

FIG. 10 illustrates the encapsulation of tier-2 dies LD in encapsulant 132, which may be similar to or the same as encapsulant 130. A planarization process is then performed to level the top surfaces of tier-2 dies LD and encapsulant 132. The respective process is illustrated as process 220 in the process flow 200 as shown in FIG. 28. Throughout the description, tier-2 dies LD and encapsulant 132 are collectively referred to reconstructed wafer 133.

Figure 23:
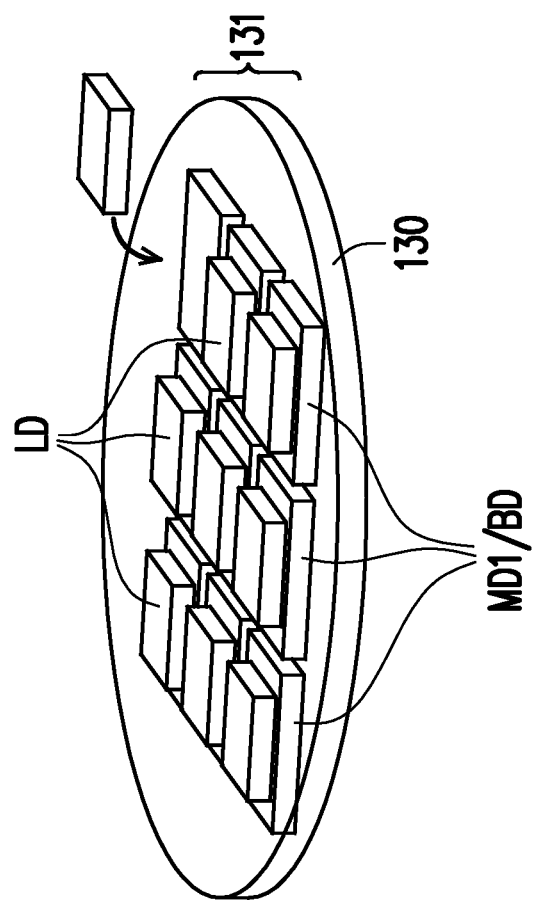
FIG. 23 illustrates a perspective view of a die-to-wafer bonding process in accordance with some embodiments.
Figure 24:
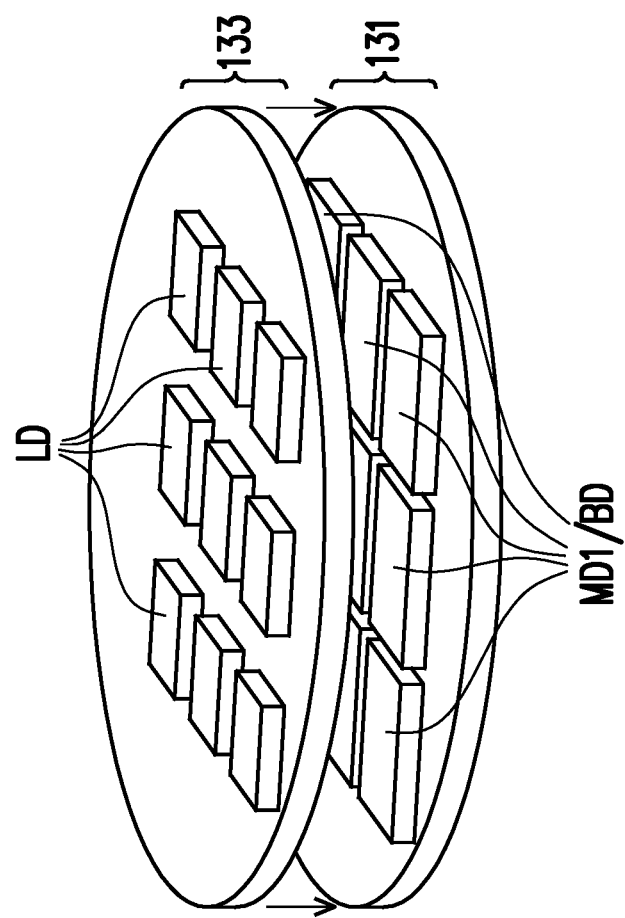
FIG. 24 illustrates a perspective view of a wafer-to-wafer bonding process in accordance with some embodiments.

In the example embodiments as shown in FIGS. 9 and 10, tier-1 dies are first placed and encapsulated to form a reconstructed wafer 131, and discrete tier-2 dies are placed on the reconstructed wafer 131 through die-to-wafer bonding. A perspective view of the die-to-wafer bonding process is shown in FIG. 23, wherein the reconstructed wafer 131 includes tier-1 dies MD1 and BD and encapsulant 130. Tier-2 dies LD are placed onto reconstructed wafer 131. FIG. 24 illustrates an alternative embodiment, in which both of reconstructed wafers 131 and 133 are pre-formed, and reconstructed wafer 133 is bonded to the reconstructed wafer 131 through wafer-to-wafer bonding. Similar to what are shown in FIGS. 23 and 24, tier-3 dies MD3 may also be bonded to tier-2 dies through die-to-wafer bonding or wafer-to-wafer bonding.

Figure 11:
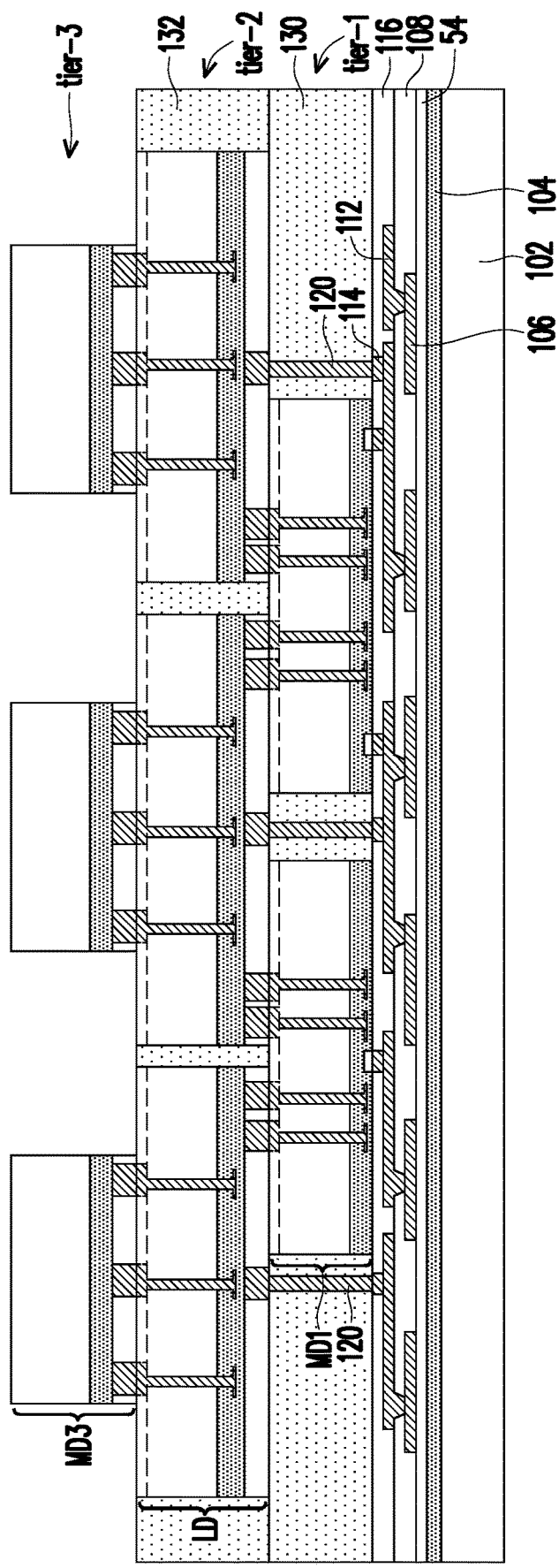

Referring to FIG. 11, tier-3 dies MD3 are bonded to tier-2 dies LD (and to reconstructed wafer 133). The respective process is illustrated as process 222 in the process flow 200 as shown in FIG. 28. In the illustrated example embodiments, tier-3 dies MD3 are bonded to tier-2 dies LD directly, with no RDLs in between. In accordance with alternative embodiments, an additional fan-out redistribution structure (not shown) including dielectric layers and RDLs may be formed on and connecting to tier-2 dies LD, and tier-3 dies MD3 are bonded to the additional fan-out redistribution structure.

Figure 12:
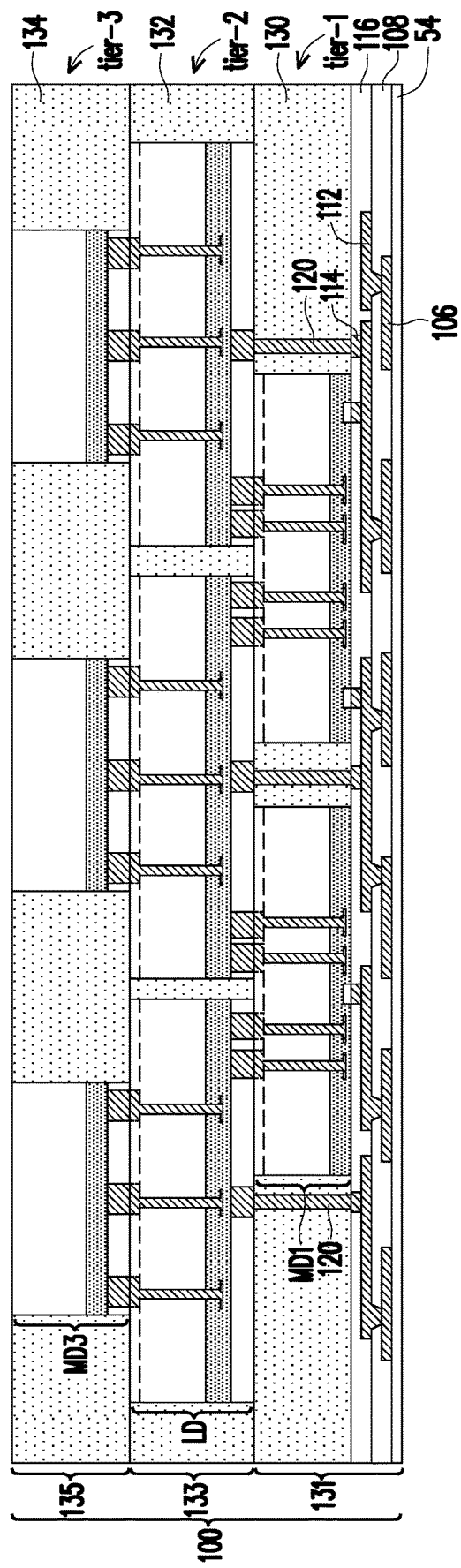

FIG. 12 illustrates the encapsulation of tier-3 dies MD3 in encapsulant 134, which may be similar to or the same as encapsulants 130 and/or 132. The respective process is illustrated as process 224 in the process flow 200 as shown in FIG. 28. A planarization process is then performed to level the top surfaces of tier-3 dies MD3 and encapsulant 134. Tier-3 dies MD3 and encapsulant 134 are collectively referred to reconstructed wafer 135. Throughout the description, the structure including dielectric layer 54 and the overlying structure is referred to as a reconstructed wafer 100, which is also referred to as computing system package loft Next, reconstructed wafer 100 de-bonded from carrier 102 (FIG. 11), for example, by projecting a laser beam on release film 104, so that release film 104 is decomposed. The respective process is illustrated as process 226 in the process flow 200 as shown in FIG. 28.

Figure 13:
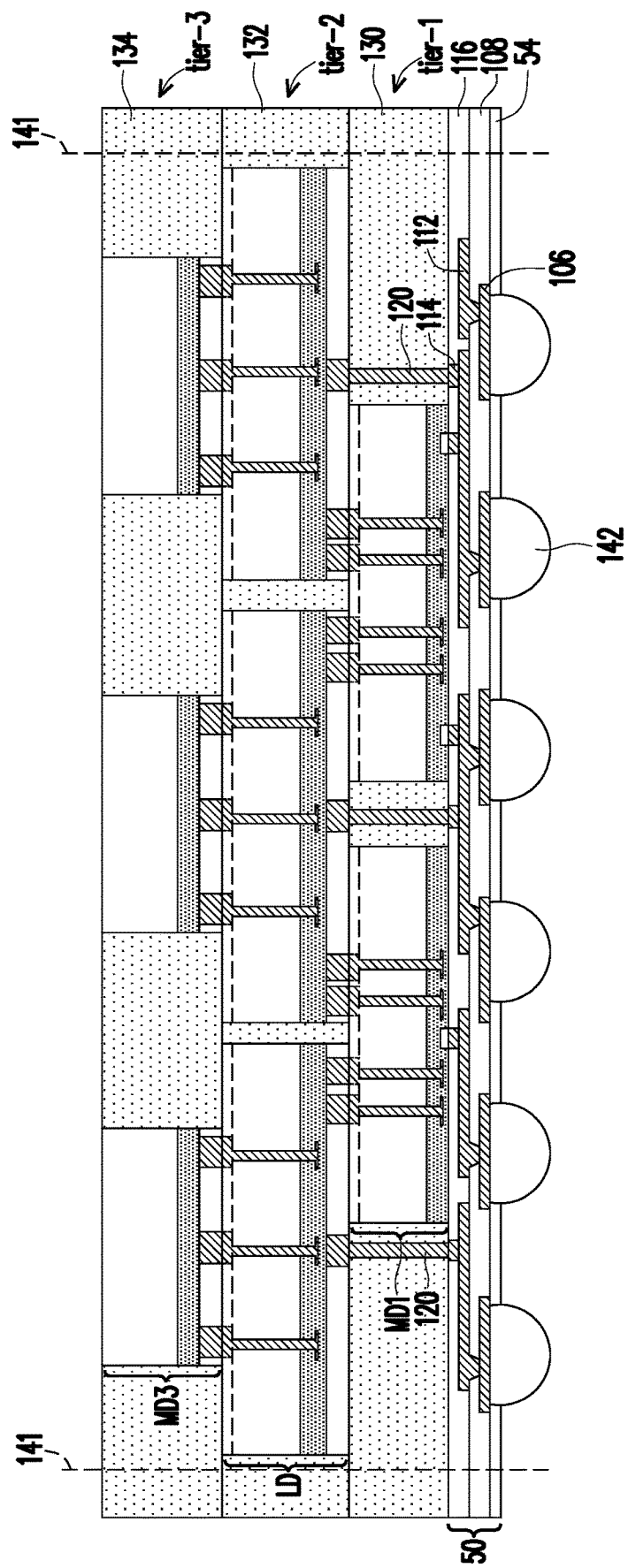

FIG. 13 illustrates the formation of electrical connectors 142, which may include solder regions, metal pads, metal pillars, or combinations thereof. The respective process is illustrated as process 228 in the process flow 200 as shown in FIG. 28. The formation process may include forming openings in dielectric layer 54, and forming electrical connectors 142 extending into the openings to contact RDLs 106.

Figure 14:
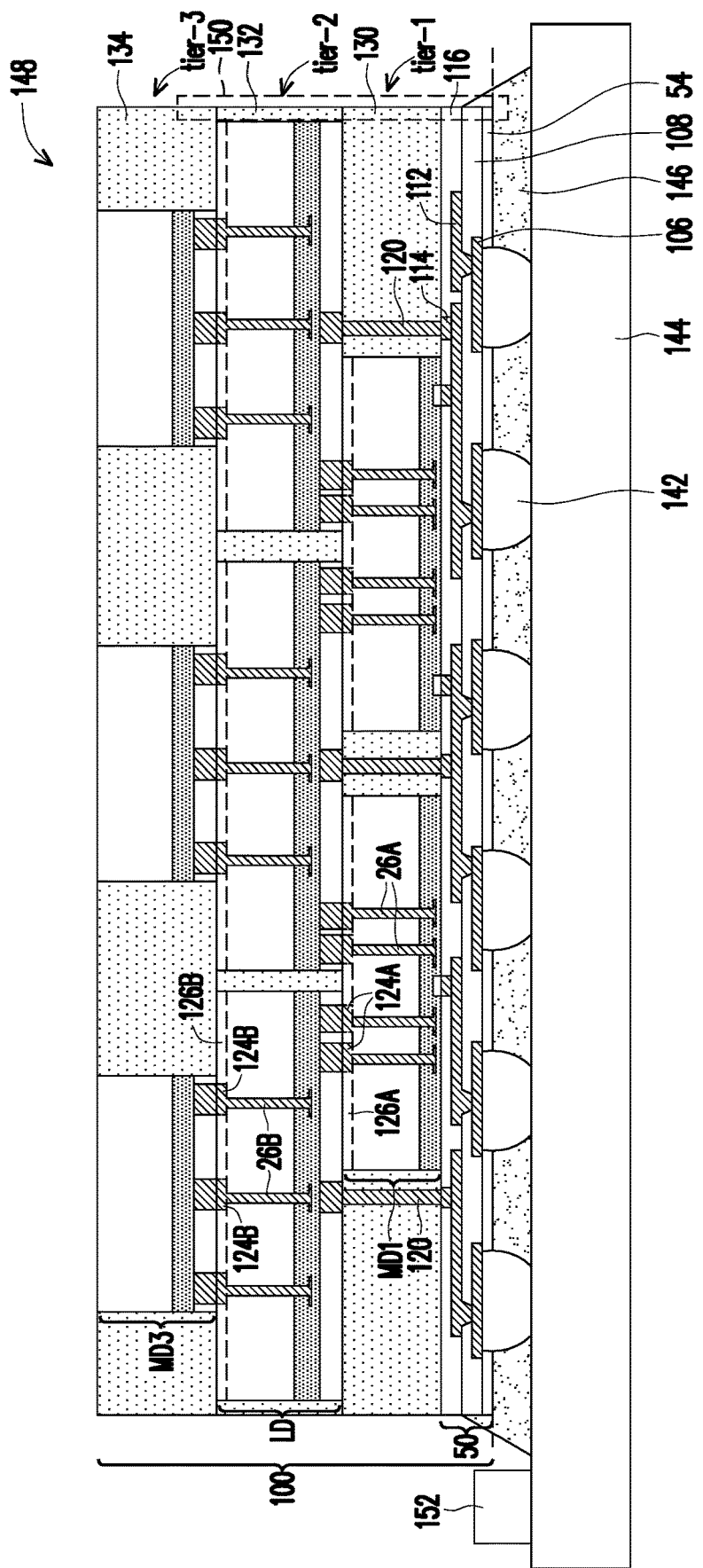

FIG. 14 illustrates the bonding of reconstructed wafer 100 to package component 144, which may be or may include a printed circuit board, a package substrate, a silicon interposer, an organic interposer, a power module, a socket, or the like. The respective process is illustrated as process 230 in the process flow 200 as shown in FIG. 28. Underfill 146 is dispensed into the gap between reconstructed wafer 100 and package component 144. Package 148 is thus formed. In accordance with some embodiments, a connector 152, which may be an adapter, a socket (including pin holes to insert pins), or the like, may be formed in package 148, for example, attached to package component 144, so that the circuits in package 148 may be electrically connected to external components.

In accordance with some embodiments, the entire reconstructed wafer wo that is not sawed is bonded to package component 144, and is included in the resulting package 148. Accordingly, reconstructed wafer wo in package 148 may have a round top view, similar to what are shown in FIGS. 23 and 24. In accordance with alternative embodiments, reconstructed wafer wo is trimmed to remove the portions that have no device dies and conductive lines, while the parts including devices and conductive line are not trimmed. In accordance with yet alternative embodiments, reconstructed wafer wo is sawed along scribe lines 141 (FIG. 13) into a plurality of identical packages, each including all of the illustrated multiple device dies as shown in FIG. 13, and one of the identical package is used to form the package as in FIG. 14.

Figure 27:
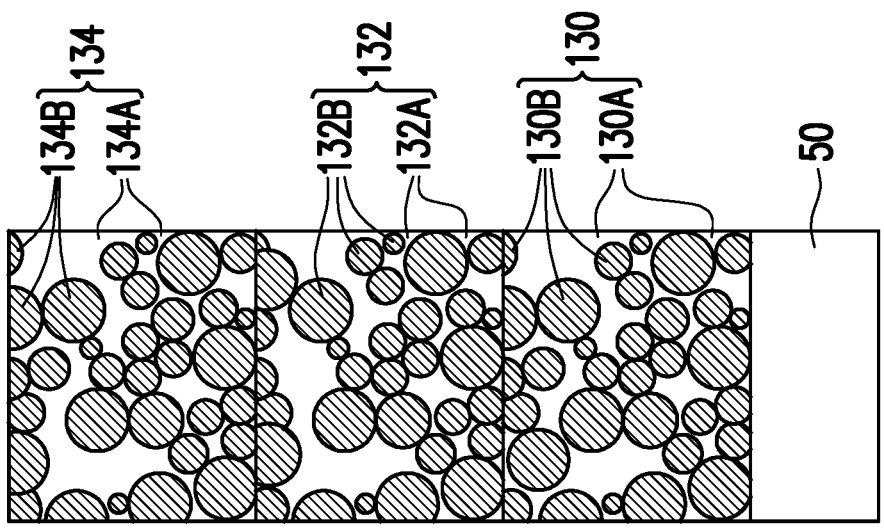
FIG. 27 illustrates an amplified view of the encapsulants in a computing system package in accordance with some embodiments.

FIG. 27 illustrates an amplified view of region 150 in FIG. 14. As shown in FIG. 27, encapsulant 130 includes base material 130A and filler particles 130B in base material 130A. Encapsulant 132 includes base material 132A and filler particles 132B in base material 130A. Encapsulant 134 includes base material 134A and filler particles 134B in base material 134A. Since no planarization is performed on the bottom surface of encapsulant 130, the spherical particles 130B that are in contact with redistribution structure 50 are rounded, with the rounded surfaces in contact with redistribution structure 50. The portions of encapsulant 130 in contact with encapsulant 132 (or the additional redistribution structure (if any)) have been planarized in the step shown in FIG. 8. Accordingly, spherical particles 130B at the top surface of encapsulant 130 are partially polished during the planarization, and hence will have substantially planar top surfaces. Similar, in each of encapsulant 132 and 134, the spherical particles 132B/134B at the bottom surfaces are not polished, and are spherical, while the spherical particles 132B/134B at the top surfaces are polished, and are partial spherical particles with round bottom surface and planar top surfaces.

FIGS. 15A, 15B, 15C, 16A, 16B, 16C, 17A, 17B, 17C, 19A, 19B, 20A, 20B, 21A, 21B, 22A, and 22B illustrate the cross-sectional views of computing system packages 100 in accordance with alternative embodiments. These embodiments are similar to the embodiments shown in FIGS. 1A, 1B, 1C, 1D, 1E, 1F, and 1G (and FIGS. 2 through 13), with some parts modified. Accordingly, the discussion provided in preceding embodiments may also be applied to these embodiments whenever applicable.

The embodiments shown in FIGS. 15A, 15B, 15C, 16A, 16B, 16C, 17A, 17B, and 17C may also be obtained from the reference cross-sections 1A-1A, 1F-1F, and 1G-1G in FIGS. 1B and 1C.

Figure 15A:
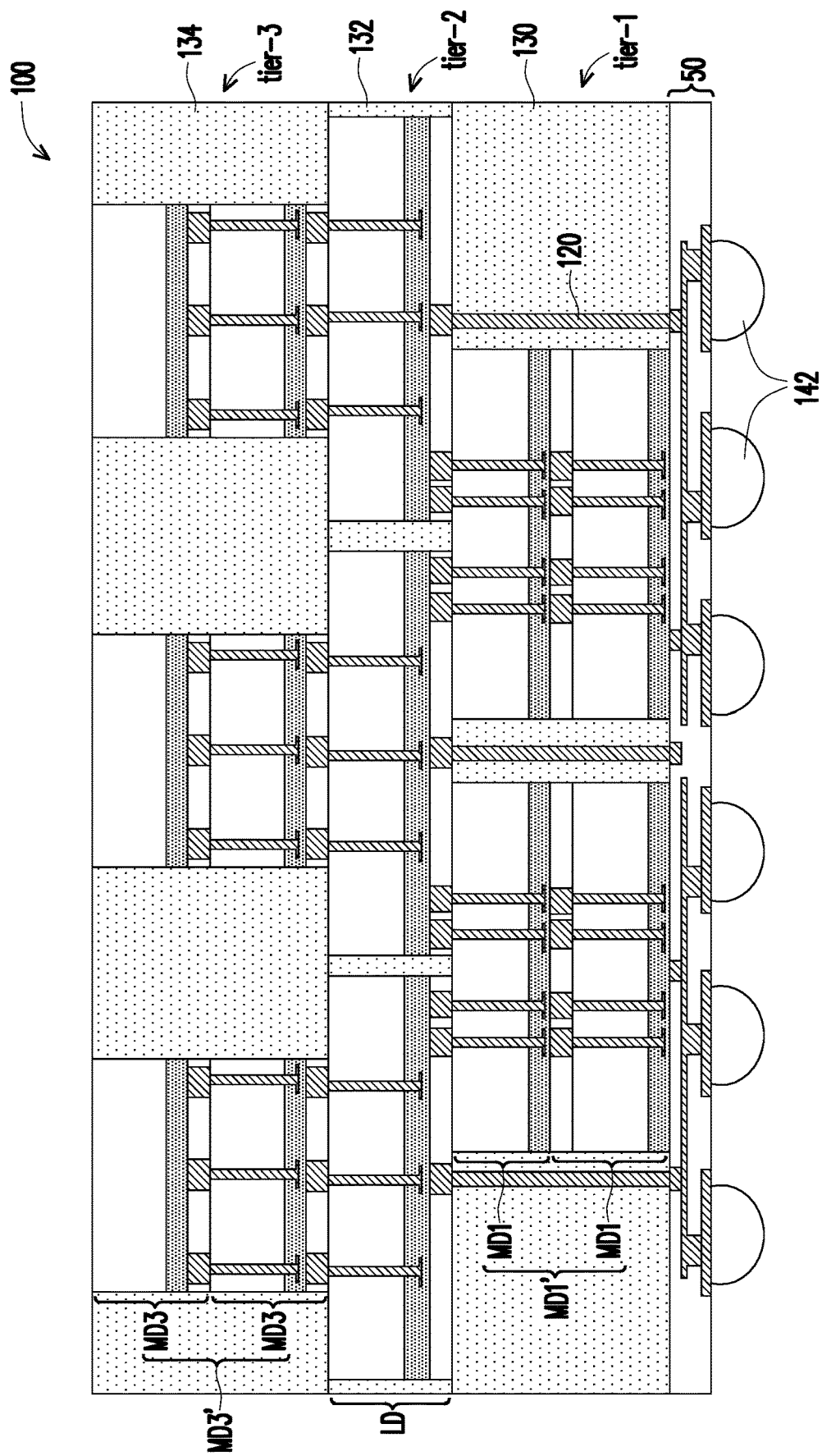
FIGS. 15A, 15B, 15C, 16A, 16B, 16C, 17A, 17B, and 17C illustrate the cross-sectional views of computing system packages in accordance with some embodiments.
Figure 15B:
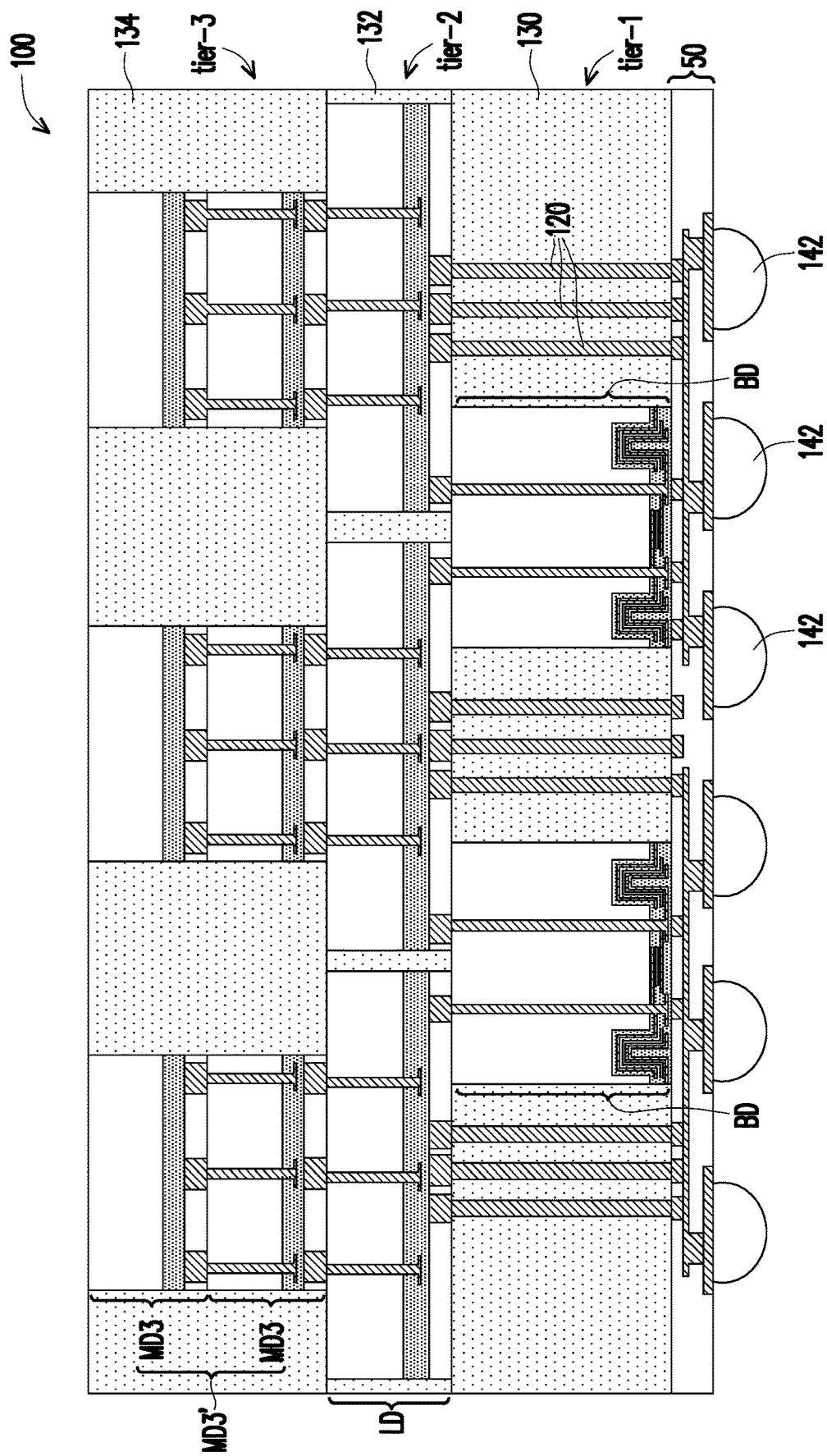
Figure 15C:
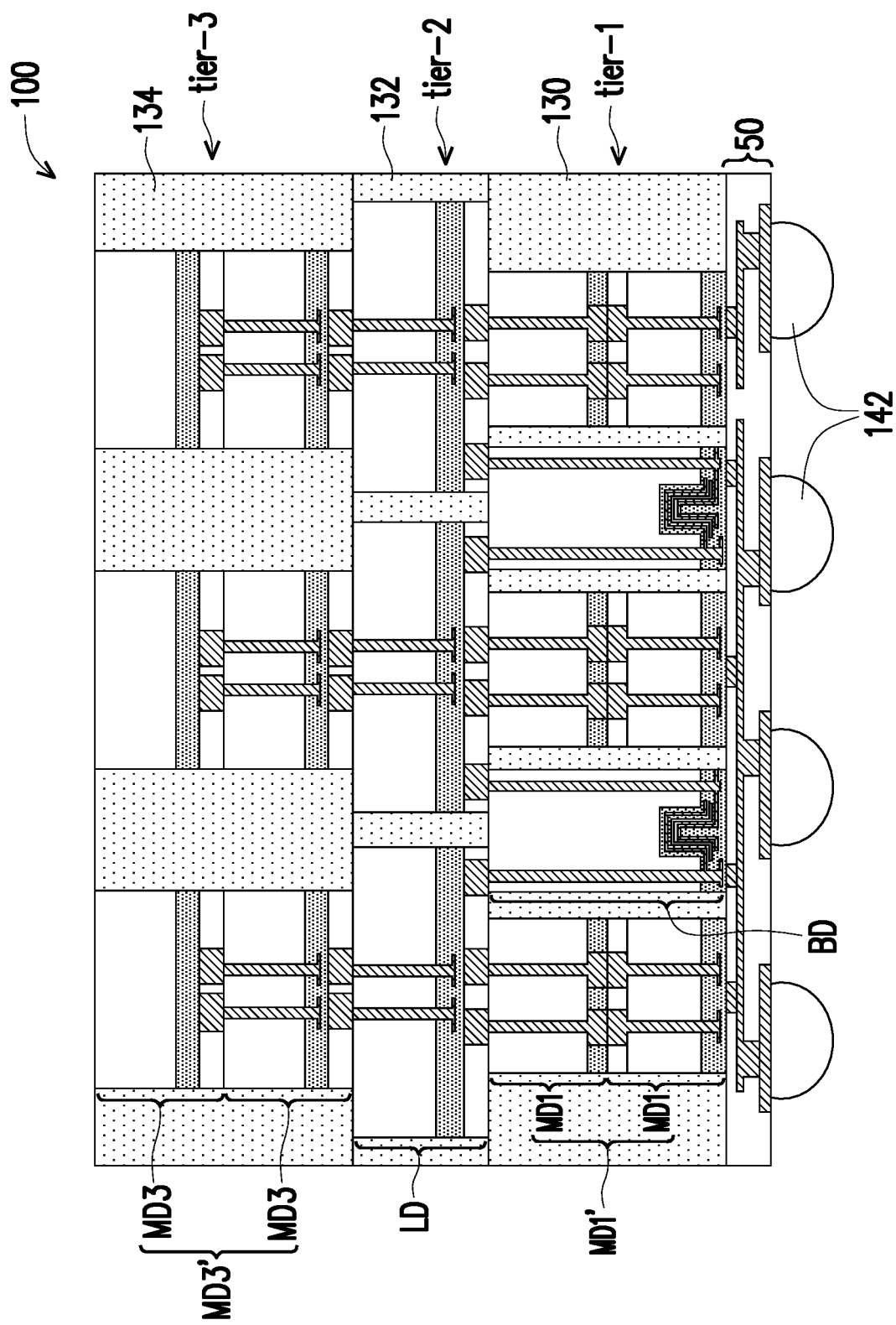

FIGS. 15A, 15B, and 15C illustrate computing system package wo in accordance with some embodiments. These embodiments are similar to the embodiments in FIGS. 1A, 1B, 1C, 1D, 1E, 1F, and 1G (which is also the structure in FIG. 13), except that in FIG. 13, each of the memory dies MD1 and MD3 is a single memory die, while in the embodiments in FIGS. 15A, 15B, and 15C, memory stacks MD1' and MD3' may be used, which includes a plurality of stacked memory dies MD1 and MD3, respectively. The plurality of memory dies MD1 may be interconnected through the through-substrate vias formed therein. Tier-1 dies, tier-2 dies, and tier-3 dies face down in accordance with these embodiments. Tier-3 dies MD3 may also be parts of die stacks MD3'.

FIGS. 16A, 16B, and 16C illustrate computing system package wo in accordance with some embodiments. These embodiments are similar to the embodiments in FIGS. 1A, 1B, 1C, 1D, 1E, 1F, and 1G (which is also the structure in FIG. 13), except that in FIG. 13, tier-1 dies MD1 and BD face down, while in the embodiments in FIGS. 16A, 16B, and 16C, tier-1 dies MD1 and BD face up. Tier-2 dies LD and tier-3 dies MD3 still face down.

Figure 17A:
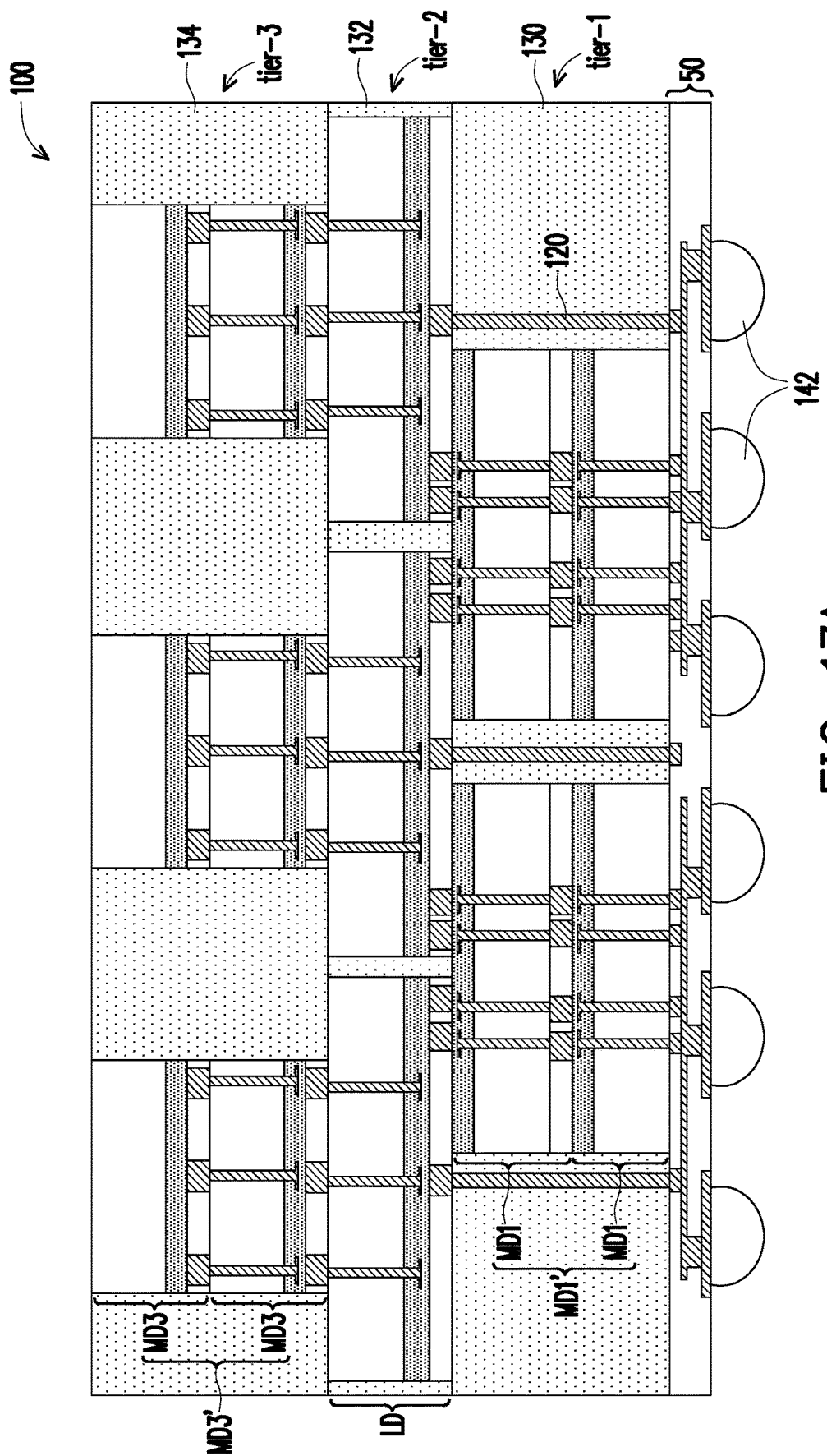
Figure 17B:
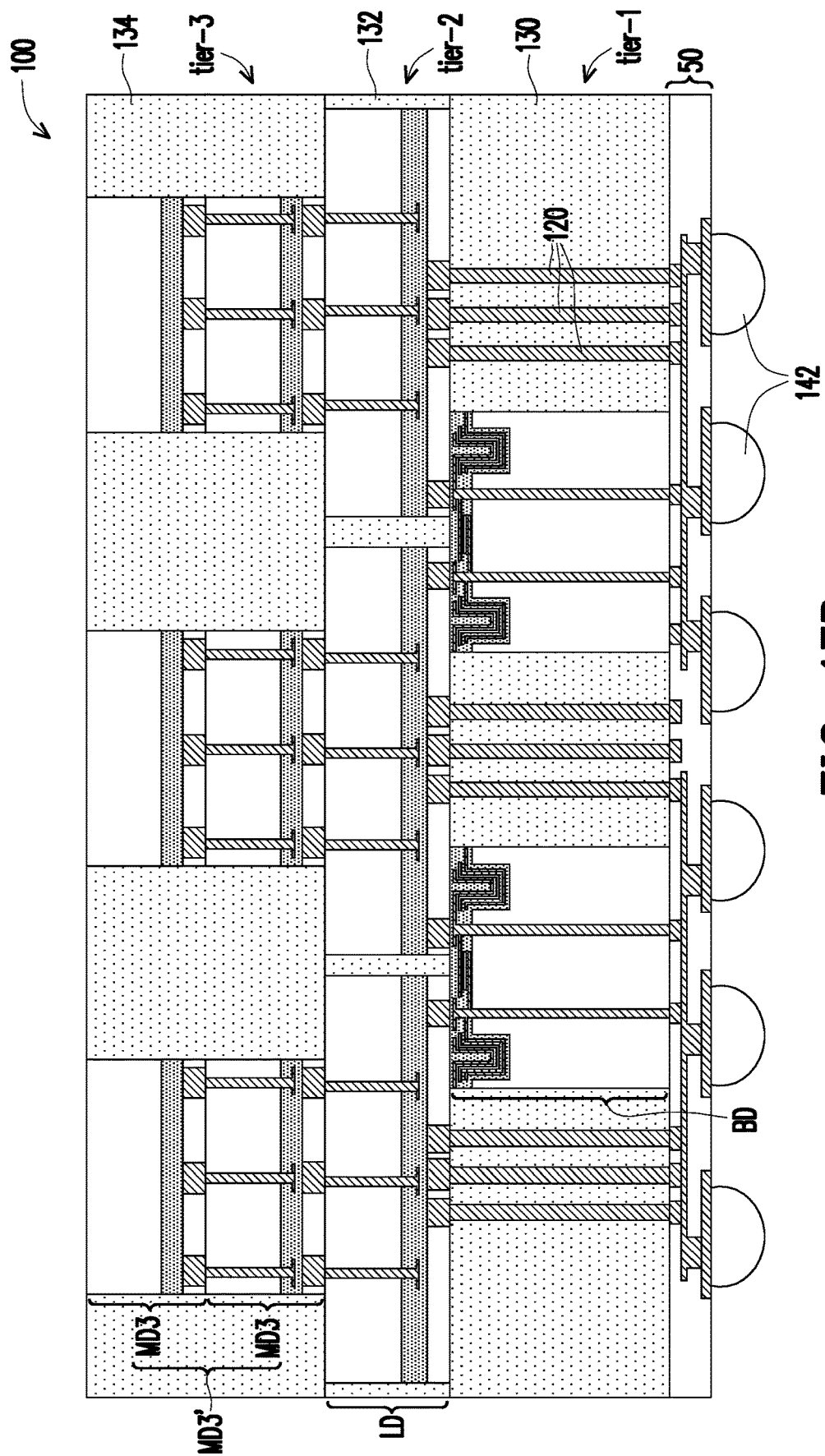
Figure 17C:
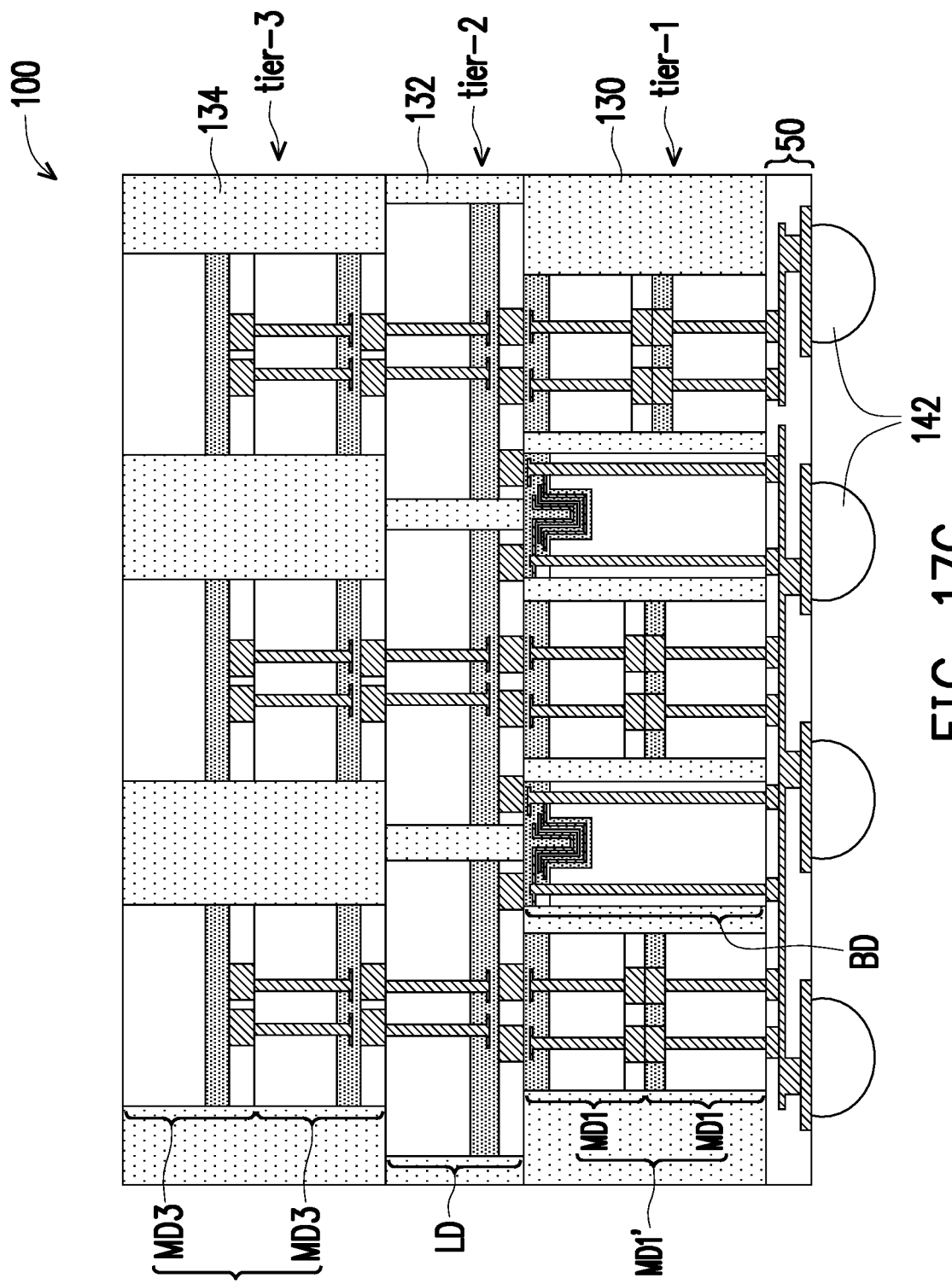

FIGS. 17A, 17B, and 17C illustrate the computing system package boo in accordance with some embodiments. These embodiments are similar to the embodiments in FIGS. 15A, 15B, and 15C, except that in FIGS. 15A, 15B, and 15C, the memory dies MD1 and bridge dies BD face down, while in the embodiments in FIGS. 17A, 17B, and 17C, the memory dies MD1 and bridge dies BD face up. Tier-2 dies LD and tier-3 dies MD3 still face down.

Figure 18A:
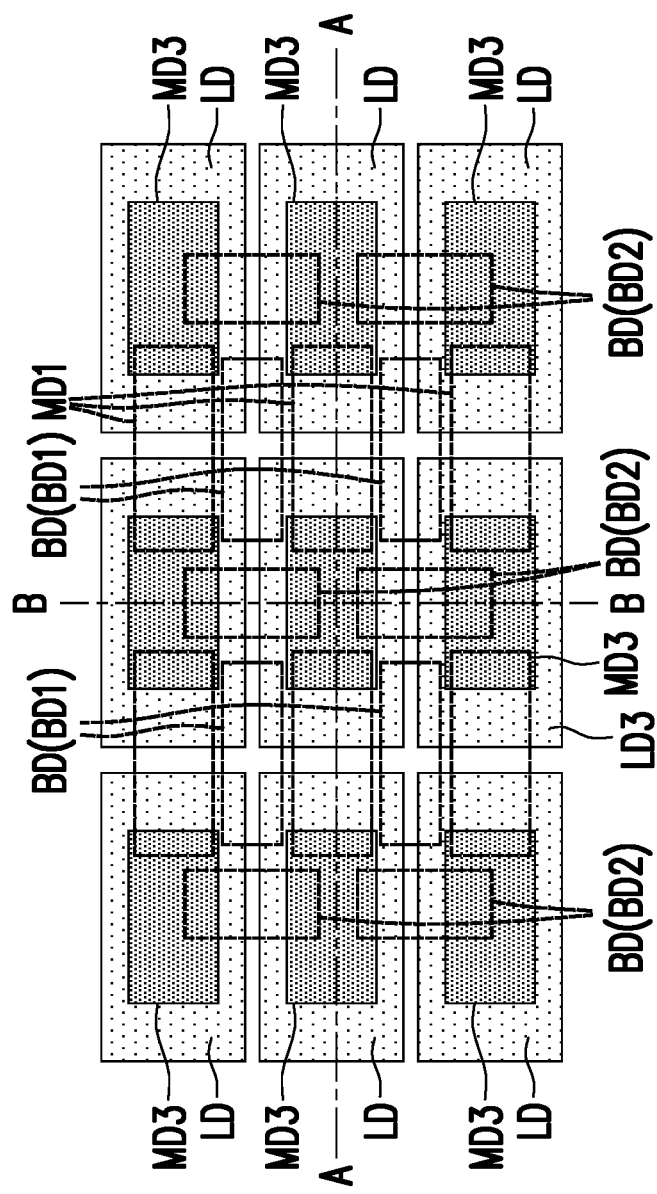
FIGS. 18A and 18B illustrate the top and bottom views of computing system packages in accordance with some embodiments.
Figure 18B:
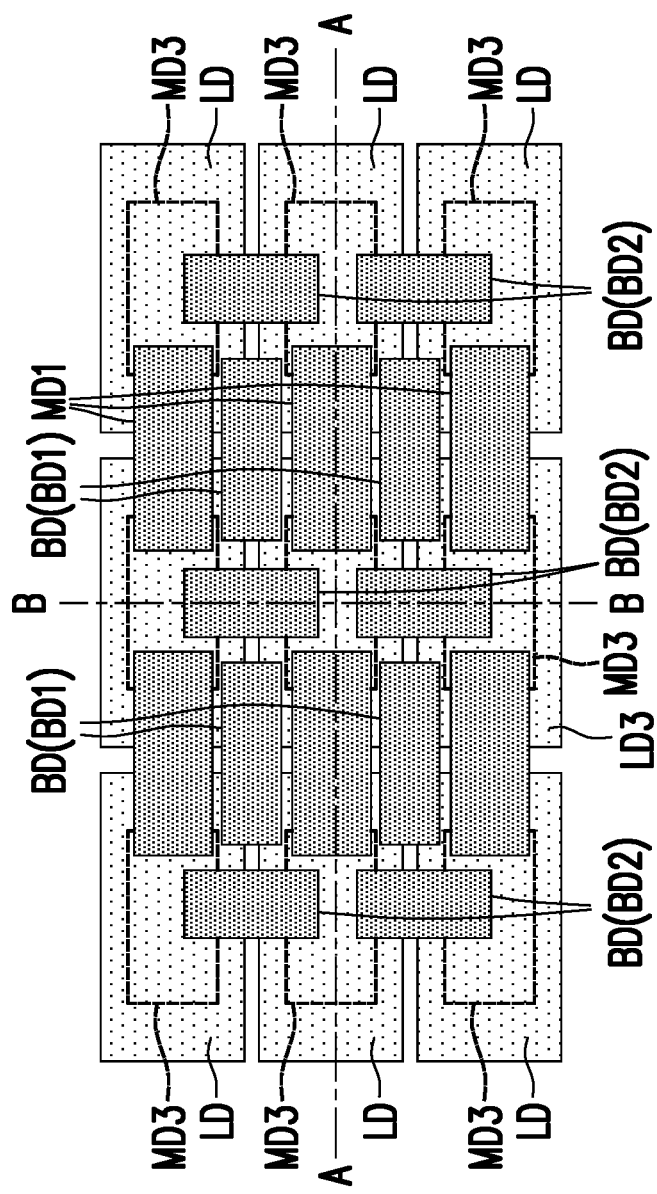

FIGS. 18A and 18B illustrate a top view and a bottom view, respectively, of a computing system package wo in accordance with some embodiments, these embodiments are similar to the embodiments as shown in FIGS. 1B and 1C, except that besides bridge dies BD (marked as BD1) that interconnect four logic dies, bridge dies BD (marked as BD2) may be added to interconnect two neighboring logic dies LD. In accordance with alternative embodiments, the bridge dies BD1 are not formed, while bridge dies BD2 are formed. In subsequent FIGS. 19A, 19B, 20A, 20B, 21A, 21B, 22A, and 22B, the figures whose figure numbers including letter "A" are obtained from the reference cross-section A-A in FIGS. 18A and 18B, and the figures whose figure numbers including letter "B" are obtained from the reference cross-section B-B in FIGS. 18A and 18B.

Figure 19A:
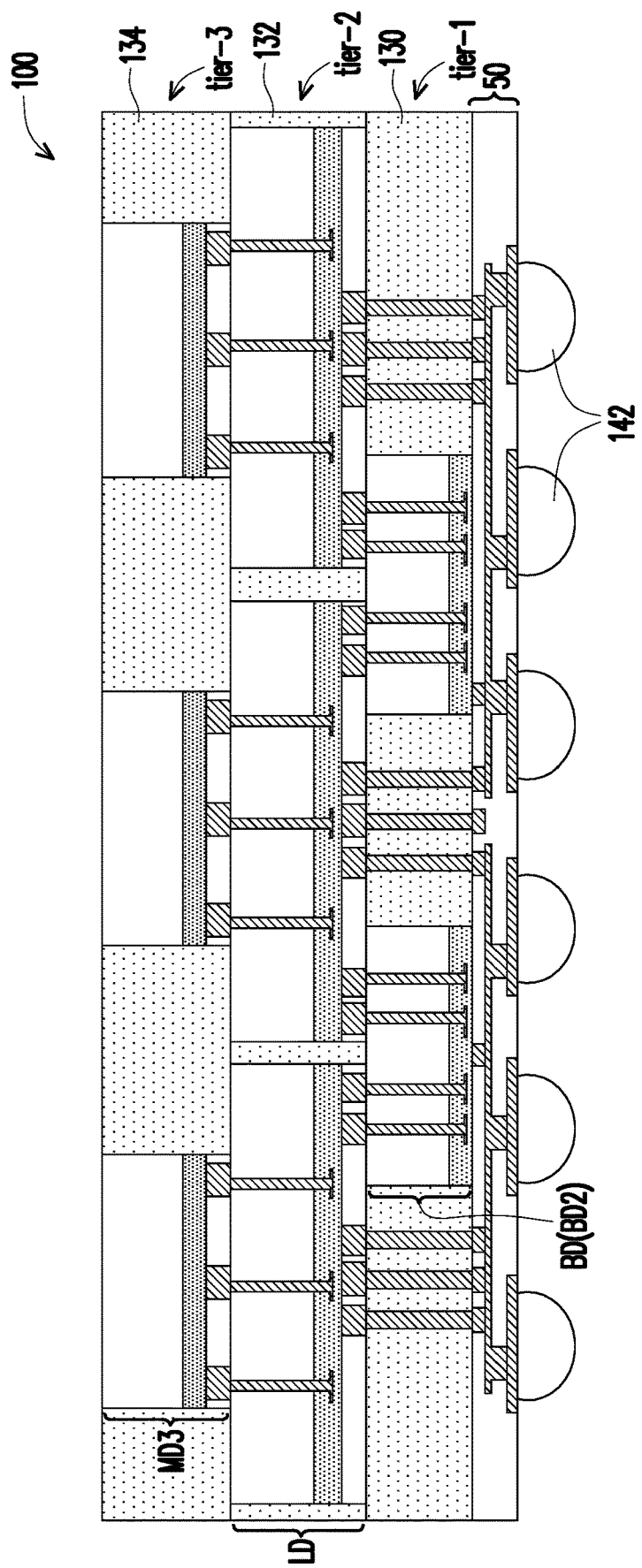
FIGS. 19A, 19B, 20A, 20B, 21A, 21B, 22A, and 22B illustrate the cross-sectional views of computing system packages in accordance with some embodiments.
Figure 19B:
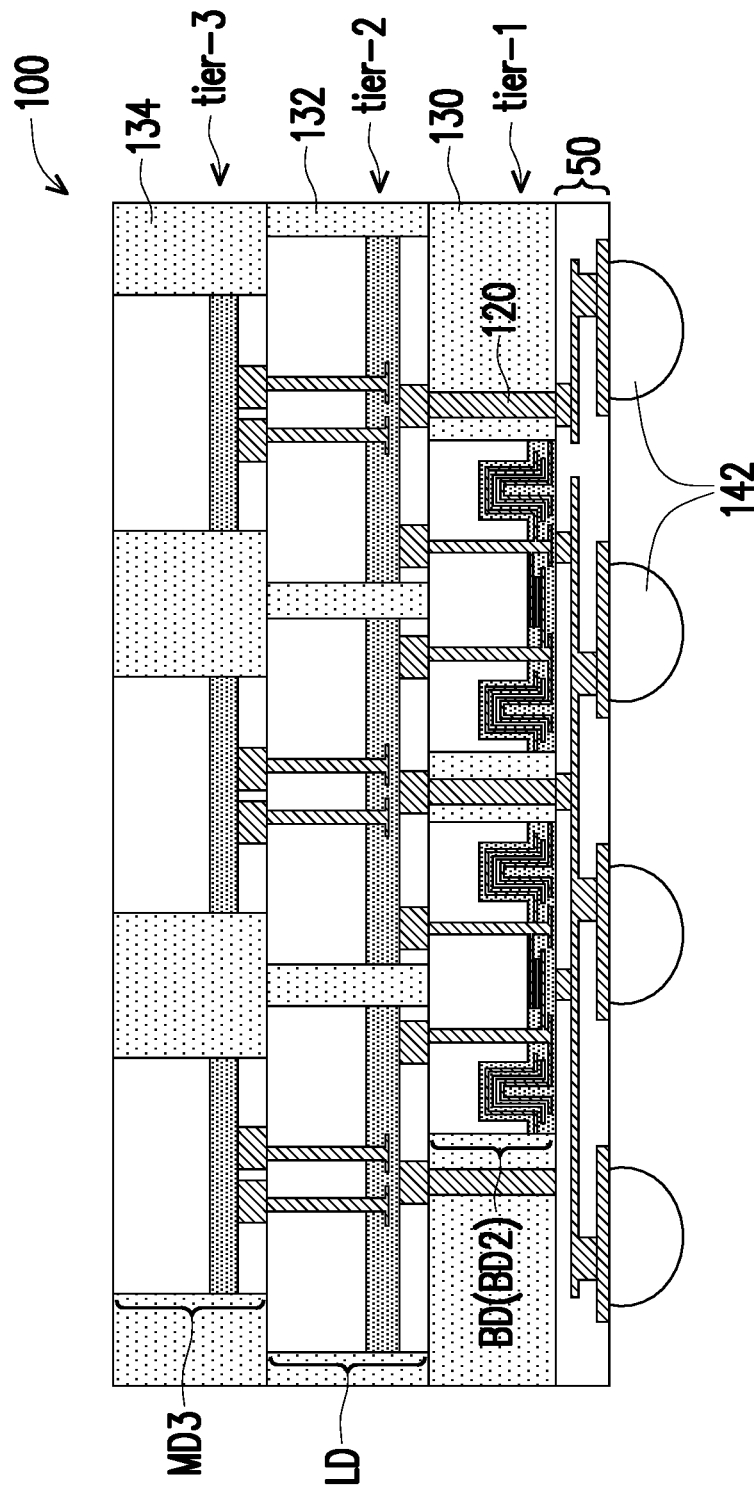

FIGS. 19A and 19B illustrate computing system package wo in accordance with some embodiments. These embodiments are similar to the embodiments in FIGS. 1A, 1B, 1C, 1D, 1E, 1F, and 1G (which is also the structure in FIG. 13), except bridge dies BD2 are added, and each of the illustrated bridge dies BD2 interconnects two tier-2 dies LD, rather than interconnects four tier-2 dies LD as bridge dies BD1. The memory dies in tier-1 and tier-3 are single memory dies.

Figure 20A:
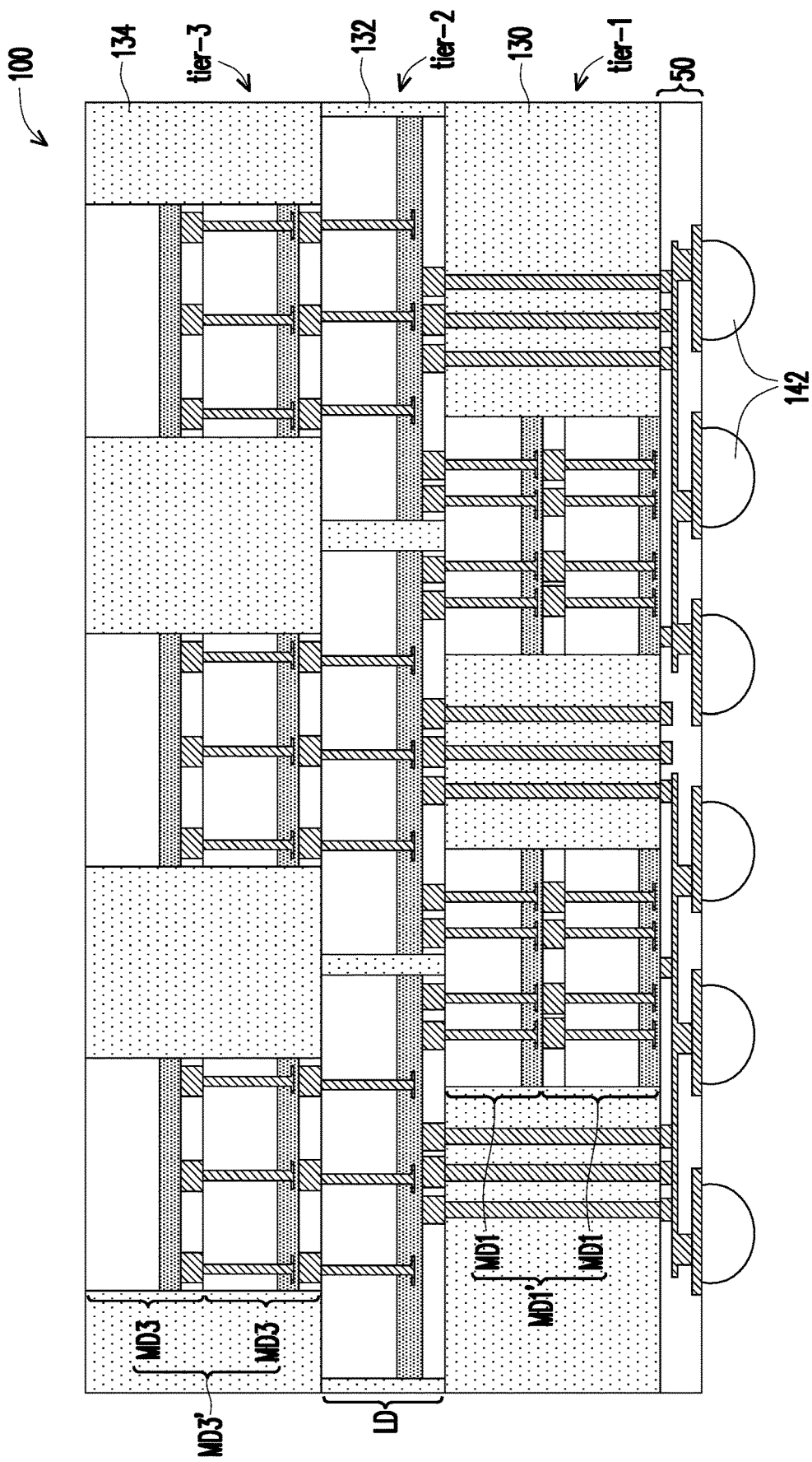
Figure 20B:
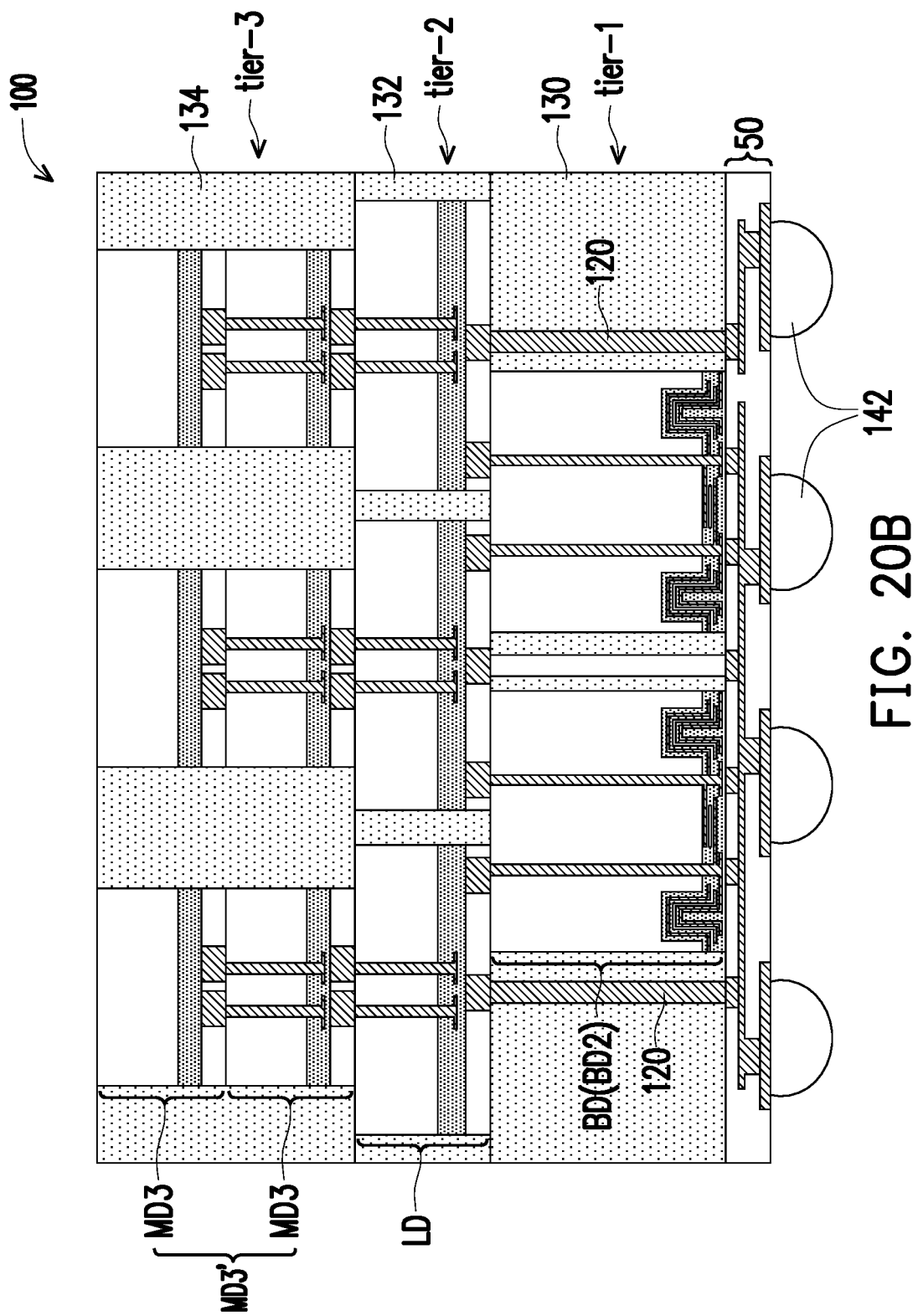

FIGS. 20A and 20B illustrate computing system package 100 in accordance with some embodiments. These embodiments are similar to the embodiments in FIGS. 19A and 19B, except in FIGS. 20A and 20B, memory die stacks MD1' and MD3' are used.

Figure 21A:
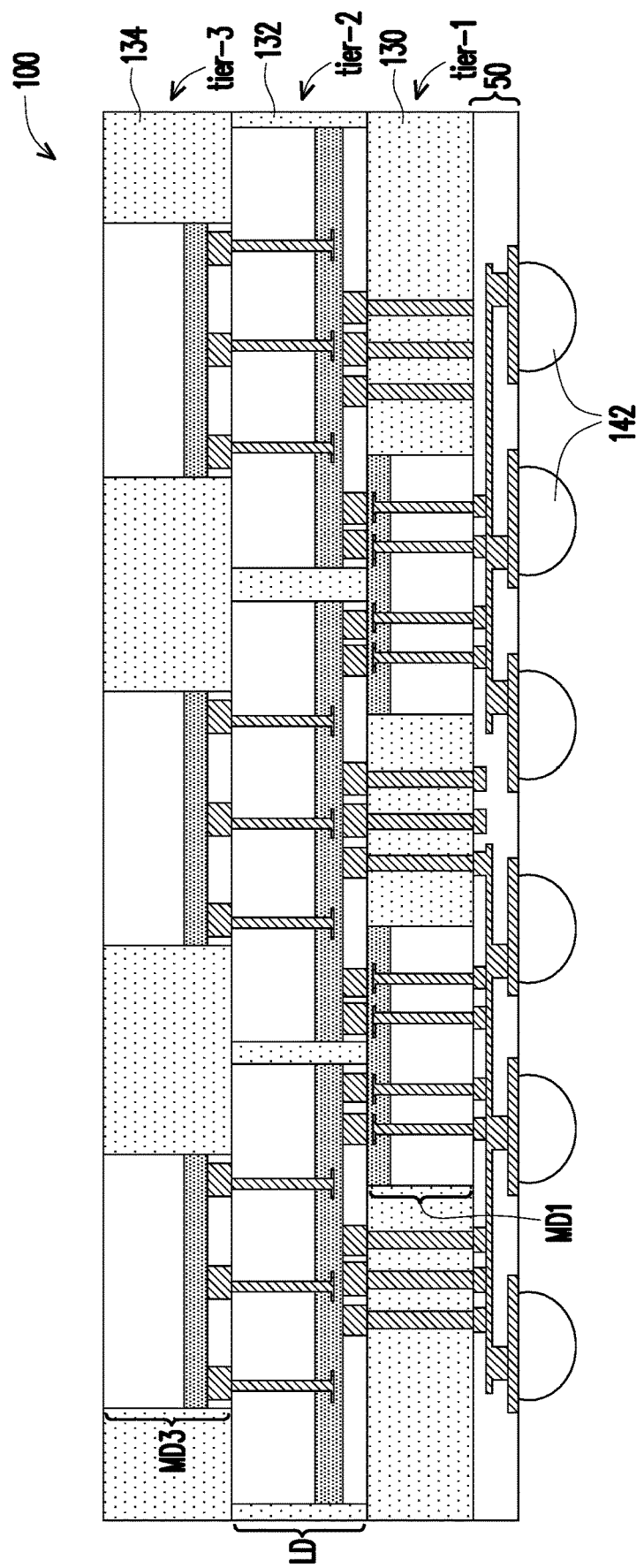
Figure 21B:
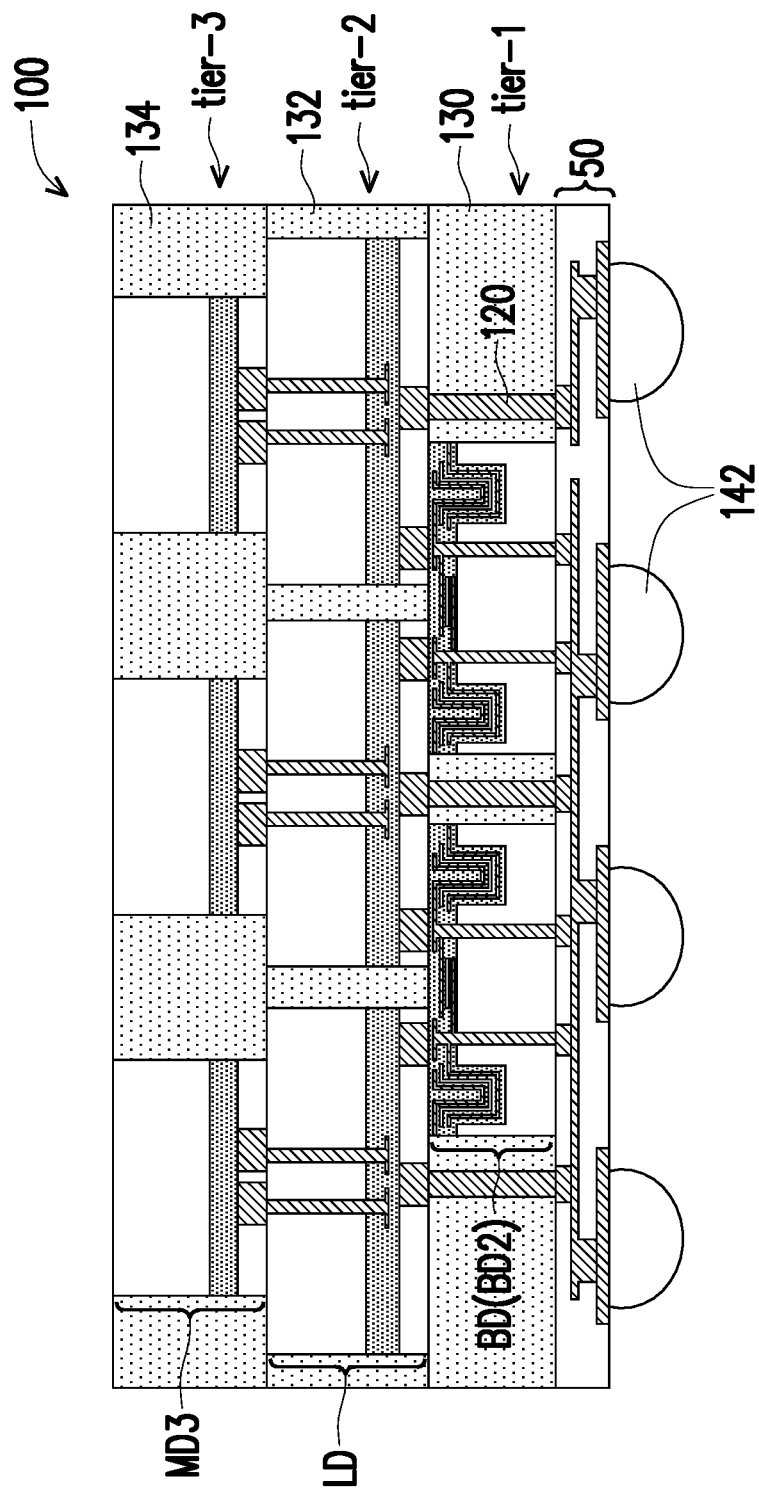

FIGS. 21A and 21B illustrate computing system package 100 in accordance with some embodiments. These embodiments are similar to the embodiments in FIGS. 19A and 19B, except that in FIGS. 19A and 19B, tier-1 dies MD1 and BD1 face down, while in FIGS. 21A and 21B, tier-1 dies MD1 and BD1 face up.

Figure 22A:
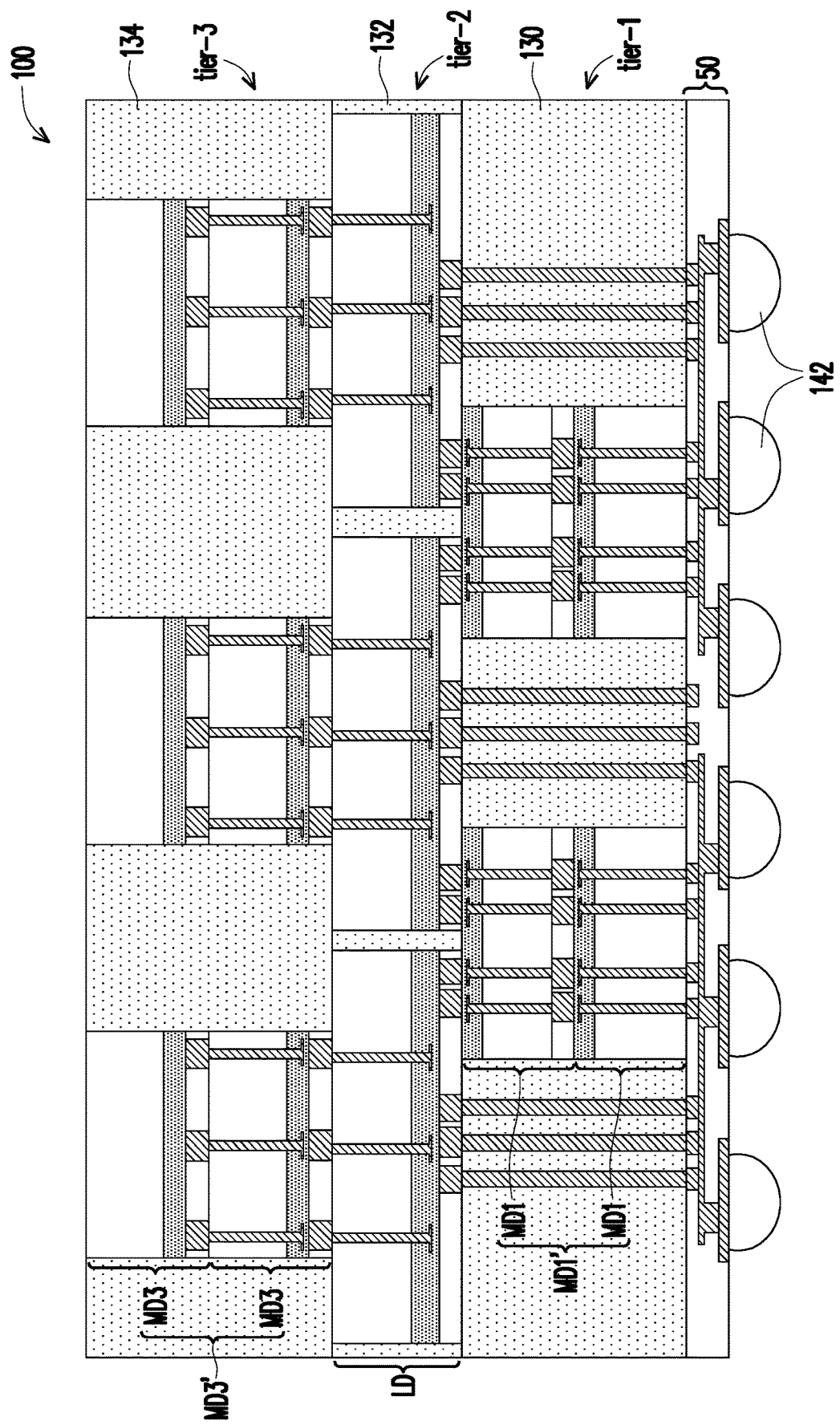
Figure 22B:
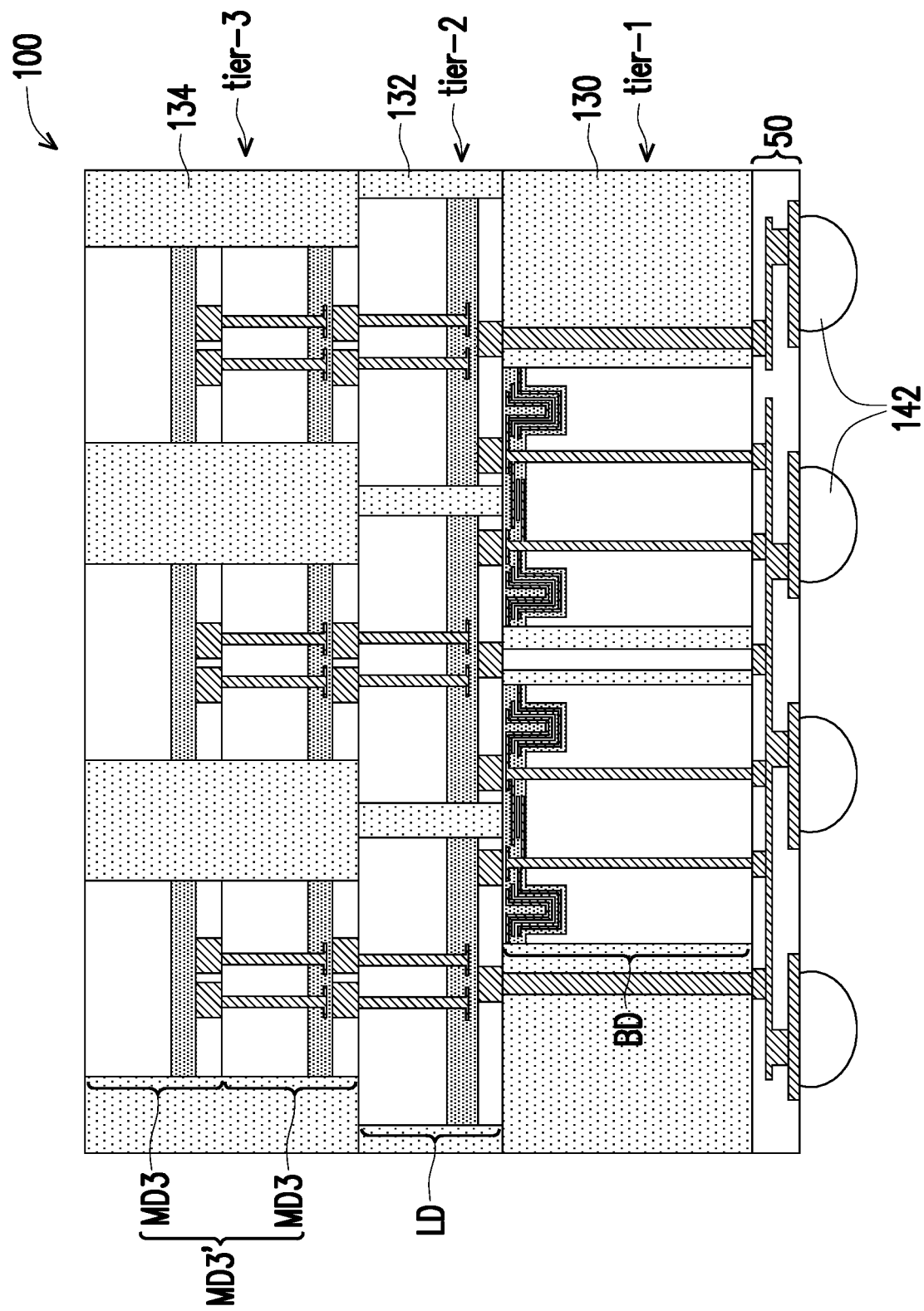

FIGS. 22A and 22B illustrate computing system package wo in accordance with some embodiments. These embodiments are similar to the embodiments in FIGS. 20A and 20B, except that in FIGS. 20A and 20B, bridge dies BD and tier-1 dies MD1 in memory die stacks MD1' face down, while in in FIGS. 22A and 22B, bridge dies BD and tier-1 dies MD1 in memory die stacks MD1' face up.

The embodiments of the present disclosure have some advantageous features. By forming computing system packages including three tiers, with the middle tier having logic dies, and memory dies in the upper and lower tiers, logic dies have shortest paths to the memory dies. Bridge dies are formed to interconnect neighboring logic dies. The scalability of the system is improved due to the adoption of arrays of logic dies, memory dies, and bridge dies. The computing efficiency may be improved, the bandwidth of the system may be increased, and the latency may be reduced.

In accordance with some embodiments of the present disclosure, a method comprises forming a reconstructed wafer, which comprises forming a redistribution structure over a carrier; bonding a first plurality of memory dies over the redistribution structure; bonding a plurality of bridge dies over the redistribution structure; bonding a plurality of logic dies over the first plurality of memory dies and the plurality of bridge dies, wherein each of the plurality of bridge dies interconnects, and is overlapped by corner regions of, four of the plurality of logic dies; and bonding a second plurality of memory dies over the plurality of logic dies, wherein the plurality of logic dies form a first array, and the second plurality of memory dies form a second array. In accordance with an embodiment, the method further comprises bonding a package component to the reconstructed wafer to form an additional package. In accordance with an embodiment, at a time of the package component is bonded to the reconstructed wafer, the reconstructed wafer comprises the first array and the second array. In accordance with an embodiment, the method further comprises attaching a socket to the additional package, wherein at a time after the socket is attached, the reconstructed wafer comprises both of the first array and the second array. In accordance with an embodiment, the method further comprises encapsulating the first plurality of memory dies and the plurality of bridge dies in a first encapsulant; encapsulating the plurality of logic dies in a second encapsulant; and encapsulating the second plurality of memory dies in a third encapsulant. In accordance with an embodiment, the reconstructed wafer is free from logic dies in the first encapsulant and the third encapsulant, and free from memory dies in the second encapsulant. In accordance with an embodiment, the plurality of logic dies have bottom surfaces in physical contact with a top surface of the first encapsulant. In accordance with an embodiment, the second encapsulant is encapsulated over, and is in physical contact with, the first encapsulant. In accordance with an embodiment, the first plurality of memory dies are identical to each other, the plurality of logic dies are identical to each other, and the second plurality of memory dies are identical to each other. In accordance with an embodiment, the plurality of logic dies are bonded to the first plurality of memory dies through hybrid bonding. In accordance with an embodiment, the bonding the plurality of logic dies over the first plurality of memory dies and the plurality of bridge dies is performed through die-to-wafer bonding. In accordance with an embodiment, the bonding the plurality of logic dies over the first plurality of memory dies and the plurality of bridge dies is performed through a wafer-to-wafer bonding process comprising encapsulating the first plurality of memory dies and the plurality of bridge dies to form a first reconstructed wafer; encapsulating the plurality of logic dies to form a second reconstructed wafer; and bonding the second reconstructed wafer to the first reconstructed wafer through wafer-to-wafer bonding.

In accordance with some embodiments of the present disclosure, a package comprises a redistribution structure; a first plurality of memory dies over the redistribution structure; a plurality of bridge dies over the redistribution structure; a plurality of logic dies over the first plurality of memory dies and the plurality of bridge dies, wherein each of the plurality of bridge dies interconnects, and is overlapped by corner regions of, at least two of the plurality of logic dies, wherein the plurality of logic dies are identical to each other; and a second plurality of memory dies over and bonded to the plurality of logic dies, wherein the plurality of logic dies form a first array, and the second plurality of memory dies form a second array. In accordance with an embodiment, the first plurality of memory dies are identical to each other, the second plurality of memory dies are identical to each other, the plurality of logic dies are identical to each other, and the plurality of bridge dies are identical to each other. In accordance with an embodiment, the plurality of bridge dies further comprise capacitors therein. In accordance with an embodiment, the package further comprises a first encapsulant encapsulating the first plurality of memory dies therein; a second encapsulant encapsulating the plurality of logic dies therein, wherein the plurality of logic dies have bottom surfaces contacting a top surface of the first encapsulant; and a third encapsulant encapsulating the second plurality of memory dies therein. In accordance with an embodiment, the third encapsulant is in physical contact with the second encapsulant.

In accordance with some embodiments of the present disclosure, a package comprises a reconstructed wafer, which comprises a redistribution structure comprising a plurality of redistribution lines; a plurality of bridge dies over and bonded to the redistribution structure; a plurality of logic dies over and bonded to the plurality of bridge dies, wherein at least one of the plurality of bridge dies is bonded to corner regions of four of the plurality of logic dies; and a first plurality of memory dies over and bonded to the plurality of logic dies, wherein the first plurality of memory dies are bonded to the plurality of logic dies. In accordance with an embodiment, the package further comprises a package component bonding to the reconstructed wafer. In accordance with an embodiment, the package further comprises a socket bonding to the package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a redistribution structure;
    a first plurality of memory dies over the redistribution structure, wherein the first plurality of memory dies are arranged as a first array;
    a plurality of bridge dies over the redistribution structure, wherein the plurality of bridge dies are arranged as a second array; and
    a plurality of logic dies arranged as a third array, wherein each of the plurality of bridge dies interconnects four of the plurality of logic dies, and wherein each of the plurality of logic dies is bonded to one of the first plurality of memory dies.

2. The package of claim 1, wherein the first plurality of memory dies and the plurality of bridge dies are underlying and bonding to the plurality of logic dies.

3. The package of claim 2, wherein each of the plurality of bridge dies between two of the first plurality of memory dies.

4. The package of claim 2 further comprising a second plurality of memory dies overlapping and bonding to the plurality of logic dies.

5. The package of claim 4 further comprising:
    a first encapsulant encapsulating the plurality of bridge dies and the first plurality of memory dies therein;

a second encapsulant encapsulating the plurality of logic dies therein; and a third encapsulant encapsulating the second plurality of memory dies therein.

6. The package of claim 5, wherein the first encapsulant and the second encapsulant form a first distinguishable interface, and the second encapsulant and the third encapsulant form a second distinguishable interface.

7. The package of claim 6, wherein top surfaces of the first encapsulant, the second encapsulant, and the third encapsulant are coplanar with top surfaces of the plurality of bridge dies, the plurality of logic dies, and the second plurality of memory dies, respectively.

8. The package of claim 1, wherein each of the first plurality of memory dies is overlapped by two of the plurality of logic dies.

9. The package of claim 1, wherein the first plurality of memory dies are identical to each other, the plurality of bridge dies are identical to each other, and the plurality of logic dies are identical to each other.

10. The package of claim 1, wherein the first plurality of memory dies are identical to each other, the plurality of bridge dies are identical to each other, and the plurality of logic dies comprises a first logic die and a second logic die different from the first logic die.

11. The package of claim 1, wherein the plurality of bridge dies further comprise capacitors therein.

12. A package comprising:
a reconstructed wafer comprising:
  a redistribution structure comprising a plurality of redistribution lines;
  a plurality of bridge dies over the redistribution structure;
  a plurality of logic dies over and electrically connected to the plurality of bridge dies, wherein each of the plurality of bridge dies is bonded to, and physically contacts, corner regions of four of the plurality of logic dies; and
  a first plurality of memory dies, wherein the first plurality of memory dies are bonded to, and are in physical contact with, the plurality of logic dies, and wherein the plurality of bridge dies, the plurality of logic dies, and the first plurality of memory dies form a first array, a second array, and a third array, respectively.

13. The package of claim 12 further comprising:
a first molding compound, with the first plurality of memory dies and the plurality of bridge dies being in the first molding compound; and a second molding compound forming a first interface with the first molding compound, wherein the plurality of logic dies are in the second molding compound.

14. The package of claim 13, wherein the first interface is coplanar with a second interface between one of the plurality of bridge dies and one of the plurality of logic dies.

15. The package of claim 12, wherein the first array and the third array are interlaced.

16. The package of claim 12, wherein the first plurality of memory dies are underlying the plurality of logic dies, and the package further comprises a second plurality of memory dies, and wherein each of the logic dies is vertically aligned to two of the first plurality of memory dies and one of the second plurality of memory dies.

17. The package of claim 12, wherein the plurality of logic dies comprise capacitors therein.

18. A package comprising:
a first plurality of memory dies forming a first array;
a plurality of bridge dies forming a second array, wherein the first array and the second array are interlaced;
a plurality of logic dies, each being over and bonding to four of the plurality of bridge dies, and over and bonding to two of the first plurality of memory dies, wherein the plurality of logic dies form a third array; and
a second plurality of memory dies forming a fourth array, wherein each of the second plurality of memory dies is over and bonding to one of the plurality of logic dies, wherein corresponding ones of the plurality of logic dies and the second plurality of memory dies are vertically aligned.

19. The package of claim 18, wherein the first array, the second array, the third array, and the four array are comprised in a reconstructed wafer, and wherein the reconstructed wafer is bonded to a package component.

20. The package of claim 18, wherein each of the plurality of bridge dies comprises a capacitor therein.

* * * * *